United States Patent
Nemoto

(10) Patent No.: US 11,966,160 B2
(45) Date of Patent: Apr. 23, 2024

(54) RADIATION-SENSITIVE RESIN COMPOSITION AND METHOD FOR FORMING PATTERN

(71) Applicant: JSR CORPORATION, Tokyo (JP)

(72) Inventor: Ryuichi Nemoto, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 17/847,253

(22) Filed: Jun. 23, 2022

(65) Prior Publication Data

US 2022/0334479 A1 Oct. 20, 2022

Related U.S. Application Data

(63) Continuation-in-part of application No. PCT/JP2020/046514, filed on Dec. 14, 2020.

(30) Foreign Application Priority Data

Dec. 27, 2019 (JP) ................. 2019-239575

(51) Int. Cl.
| | | |
|---|---|---|
| G03F 7/004 | (2006.01) |
| G03F 7/029 | (2006.01) |
| G03F 7/039 | (2006.01) |
| G03F 7/20  | (2006.01) |
| G03F 7/30  | (2006.01) |

(52) U.S. Cl.
CPC .......... *G03F 7/0045* (2013.01); *G03F 7/0048* (2013.01); *G03F 7/0295* (2013.01); *G03F 7/0392* (2013.01); *G03F 7/2002* (2013.01); *G03F 7/30* (2013.01)

(58) Field of Classification Search
CPC ..... G03F 7/0045; G03F 7/0392; G03F 7/0397
See application file for complete search history.

(56) References Cited

U.S. PATENT DOCUMENTS

| | | | | |
|---|---|---|---|---|
| 5,976,759 | A   | * | 11/1999 | Urano ................ G03F 7/0045 430/905 |
| 6,210,859 | B1  | * | 4/2001  | Jeon ................... G03F 7/0045 430/920 |
| 2004/0033434 | A1 | * | 2/2004  | Ishihara ............. C07C 381/12 430/270.1 |
| 2005/0130057 | A1 | * | 6/2005  | Sudo ................... C08K 5/0033 430/270.1 |

FOREIGN PATENT DOCUMENTS

| | | |
|---|---|---|
| JP | 5556765 B2 | 7/2014 |
| JP | 2017120367 A | 7/2017 |
| JP | 2020140203 A | 9/2020 |

OTHER PUBLICATIONS

International Search Report dated Feb. 22, 2021 in PCT/JP2020/046514, 2 pages.
English translation of the International Preliminary Report on Patentability and Written Opinion dated Jul. 7, 2022 in PCT/JP2020/046514, 6 pages.
Frederick G. Bordwell, "Equilibrium Acidities in Dimethyl Sulfoxide Solution", Acc. Chem. Res., 1988, pp. 456-463.
Matthieu Hamel et al, Study of Intramolecular Competition between Carboxylate and Phosphonate for PtII with the Aid of a Novel Tridentate Carboxylato-Thioether-Phosphonato Ligand, Chem. Eur. J., 13, 2007, pp. 5441-5449.

* cited by examiner

*Primary Examiner* — John S Chu
(74) *Attorney, Agent, or Firm* — Element IP, PLC.

(57) ABSTRACT

A radiation-sensitive resin composition includes: an onium salt compound represented by formula (1'); a resin including a structural unit having an acid-dissociable group; and a solvent. $E^4$ is a substituted or unsubstituted $(\alpha+\beta)$-valent organic group having 1 to 40 carbon atoms; $Z^+$ is a monovalent radiation-sensitive onium cation; and $\alpha$ and $\beta$ are each independently 1 or 2.

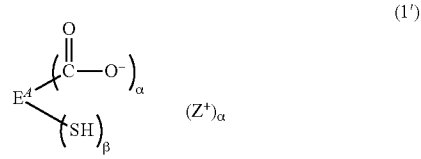

(1')

17 Claims, No Drawings

RADIATION-SENSITIVE RESIN COMPOSITION AND METHOD FOR FORMING PATTERN

CROSS-REFERENCE TO RELATED APPLICATIONS

The present application is a continuation-in-part application of International Application No. PCT/JP2020/046514, filed Dec. 14, 2020, which claims priority to Japanese Patent Application No. 2019-239575, filed Dec. 27, 2019. The contents of these applications are incorporated herein by reference in their entirety.

BACKGROUND OF THE INVENTION

Field of the Invention

The present invention relates to a radiation-sensitive resin composition and a method for forming a pattern.

Description of the Related Art

A photolithography technology using a resist composition has been used for the fine circuit formation in a semiconductor device. As the representative procedure, for example, a resist pattern is formed on a substrate by generating an acid by irradiating the coating of the resist composition with a radioactive ray through a mask pattern, and then reacting in the presence of the acid as a catalyst to generate the difference of solubility of a resin into an alkaline or organic developer between an exposed part and a non-exposed part.

In the photolithography technique, the micronization of the pattern is promoted by using a short-wavelength radioactive ray such as an ArF excimer laser or by using an immersion exposure method (liquid immersion lithography) in which exposure is performed in a state in which a space between a lens of an exposure apparatus and a resist film is filled with a liquid medium.

While efforts for further technological development are in progress, a technique has been proposed in which a quencher (acid diffusion controlling agent) is blended in a resist composition, and an acid diffused to a non-exposed part is captured by a salt exchange reaction to improve lithographic performance with ArF exposure (JP-B-5556765). In addition, as a next-generation technology, lithography using a shorter-wavelength radioactive ray such as an electron beam, an X-ray, and extreme ultraviolet (EUV) is also being studied.

SUMMARY OF THE INVENTION

According to an aspect of the present invention, a radiation-sensitive resin composition including: an onium salt compound represented by formula (1'); a resin including a structural unit having an acid-dissociable group; and a solvent.

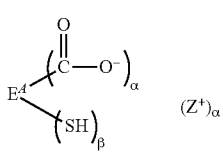

$E^A$ is a substituted or unsubstituted $(\alpha+\beta)$-valent organic group having 1 to 40 carbon atoms, $Z^+$ is a monovalent radiation-sensitive onium cation, and $\alpha$ and $\beta$ are each independently 1 or 2.

According to another aspect of the present invention, a method for forming a pattern includes: directly or indirectly applying the above-described radiation-sensitive resin composition onto a substrate to form a resist film; exposing the resist film; and developing the exposed resist film with a developer.

DESCRIPTION OF THE EMBODIMENTS

As used herein, the words "a" and "an" and the like carry the meaning of "one or more." When an amount, concentration, or other value or parameter is given as a range, and/or its description includes a list of upper and lower values, this is to be understood as specifically disclosing all integers and fractions within the given range, and all ranges formed from any pair of any upper and lower values, regardless of whether subranges are separately disclosed. Where a range of numerical values is recited herein, unless otherwise stated, the range is intended to include the endpoints thereof, as well as all integers and fractions within the range. As an example, a stated range of 1-10 fully describes and includes the independent subrange 3.4-7.2 as does the following list of values: 1, 4, 6, 10.

Among the efforts for the next-generation technology, various resist performances equal to or higher than ever before are required in terms of sensitivity, critical dimension uniformity (CDU) performance, which is an index of uniformity of sensitivity, line width, and hole diameter, and line width uniformity (LWR) performance indicating variation in line width of a resist pattern.

That is, an embodiment of the present invention relates to a radiation-sensitive resin composition including:
an onium salt compound (hereinafter, also referred to as "compound (1')") represented by formula (1') below:
a resin containing a structural unit having an acid-dissociable group; and
a solvent:

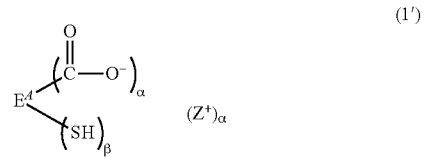

(wherein $E^A$ is a substituted or unsubstituted $(\alpha+\beta)$-valent organic group having 1 to 40 carbon atoms,
$Z^+$ is a monovalent radiation-sensitive onium cation, and
$\alpha$ and $\beta$ are each independently 1 or 2.)

The radiation-sensitive resin composition contains the compound (1') as a quencher (acid diffusion controlling agent), and thus can exhibit excellent sensitivity, CDU performance, and LWR performance in the formation of a resist pattern. Although not bound by any theory, the reason for this is presumed as follows. A relatively strong intramolecular hydrogen bond is formed between a carboxylic acid anion (—COO—) and a sulfanyl group (—SH) present in the molecule, and as a result, (the anion moiety of) the compound (1') is stabilized, and the basicity is relatively weakened, thereby promoting the acid dissociation of the acid-dissociable group due to a generated acid, to increase the sensitivity. It is presumed that the action improves the contrast between an exposed part and a non-exposed part, and thus allow excellent various resist performances to be exhibited. The organic group refers to a group containing at least one carbon atom.

The present invention relates to, in another embodiment, a method for forming a pattern, the method including the steps of:

directly or indirectly applying the radiation-sensitive resin composition onto a substrate to form a resist film;
exposing the resist film; and
developing the exposed resist film with a developer.

The method for forming a resist pattern uses the above-described radiation-sensitive resin composition excellent in sensitivity, CDU performance, and LWR performance, and therefore a high-quality resist pattern can efficiently be formed.

Hereinbelow, embodiments of the present invention will be described in detail, but the present invention is not limited to these embodiments.

<Radiation-Sensitive Resin Composition>

The radiation-sensitive resin composition (hereinafter, also simply referred to as "composition") according to the present embodiment contains a compound (1'), a resin, and a solvent. The radiation-sensitive resin composition further contains a radiation-sensitive acid generator, as necessary. The composition may contain other optional components as long as the effects of the present invention are not impaired.

(Compound (1'))

The compound (1') can function as a quencher (also referred to as a "photodegradable base" or "acid diffusion controlling agent") that captures acid before exposure or acid in a non-exposed part. The compound (1') is represented by the following formula (1').

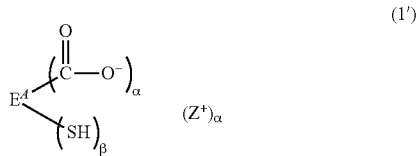

In the formula (1'), $E^4$ is a substituted or unsubstituted ($\alpha+\beta$)-valent organic group having 1 to 40 carbon atoms.

$Z^+$ is a monovalent radiation-sensitive onium cation, and $\alpha$ and $\beta$ are each independently 1 or 2.

When the compound (1') is contained, high levels of sensitivity, CDU performance, and LWR performance can be imparted to the radiation-sensitive resin composition.

In the formula (1'), the substituted or unsubstituted ($\alpha+\beta$)-valent organic group having 1 to 40 carbon atoms represented by $E^4$ is not particularly limited. Since 06 and R are each independently 1 or 2, the ($\alpha+\beta$)-valent organic group can be divalent to tetravalent. Examples of such an organic group include a group obtained by removing ($\alpha+\beta-1$) hydrogen atoms from a substituted or unsubstituted monovalent organic group having 1 to 40 carbon atoms. The substituted or unsubstituted monovalent organic group having 1 to 40 carbon atoms may be a group containing any of a chain structure, a cyclic structure, or a combination thereof. Examples of the chain structure include chain hydrocarbon groups that may either be saturated or unsaturated and linear or branched. Examples of the cyclic structure include cyclic hydrocarbon groups that may be alicyclic, aromatic, or heterocyclic. Among them, the substituted or unsubstituted monovalent organic group is preferably a substituted or unsubstituted monovalent chain hydrocarbon group having 1 to 20 carbon atoms, a substituted or unsubstituted monovalent alicyclic hydrocarbon group having 3 to 20 carbon atoms, a substituted or unsubstituted monovalent aromatic hydrocarbon group having 6 to 20 carbon atoms, or a combination thereof. In particular, the substituted or unsubstituted monovalent organic group is preferably a substituted or unsubstituted monovalent aromatic hydrocarbon group having 6 to 20 carbon atoms or a combination thereof. Other examples of the monovalent organic group include a group obtained by substituting part or all of hydrogen atoms contained in a group having a chain structure or a group having a cyclic structure by a substituent and a group containing, between carbon atoms of such a group, CO, CS, O, S, SO$_2$ or NR' or a combination of two or more of them (R' is a monovalent organic group having 1 to 20 carbon atoms).

Examples of the substituent that substitutes part or all of the hydrogen atoms of the organic group include halogen atoms such as a fluorine atom, a chlorine atom, a bromine atom, and an iodine atom; a hydroxy group; a carboxy group; a cyano group; a nitro group; an alkyl group, an alkoxy group, an alkoxycarbonyl group, an alkoxycarbonyloxy group, an acyl group, an acyloxy group, or a group in which a hydrogen atom of these groups has been substituted with a halogen atom; and an oxo group (=O).

Examples of the monovalent chain hydrocarbon group having 1 to 20 carbon atoms include a linear or branched saturated hydrocarbon group having 1 to 20 carbon atoms, or a linear or branched unsaturated hydrocarbon group having 1 to 20 carbon atoms. The number of carbon atoms may be 1 or more, but the lower limit thereof is preferably 2, more preferably 3, and still more preferably 4. The upper limit of the number of carbon atoms is preferably 18, and more preferably 16.

Among them, the chain hydrocarbon group is preferably a substituted or unsubstituted linear or branched hydrocarbon group having 1 to 10 carbon atoms. Thereby, the formability of an intramolecular hydrogen bond between the carboxylic acid anion and the sulfanyl group, the diffusion length controllability of the compound (1') itself, and the solubility in a solvent, and the like can be favorably exhibited.

Examples of the monovalent alicyclic hydrocarbon group having 3 to 20 carbon atoms include a monocyclic or polycyclic saturated hydrocarbon group, or a monocyclic or polycyclic unsaturated hydrocarbon group. The monocyclic saturated hydrocarbon group is preferably a cyclopentyl group, a cyclohexyl group, a cycloheptyl group, or a cyclooctyl group. The polycyclic cycloalkyl group is preferably a bridged alicyclic hydrocarbon group such as a norbornyl group, an adamantyl group, a tricyclodecyl group, or a tetracyclododecyl group. The bridged alicyclic hydrocarbon group refers to a polycyclic alicyclic hydrocarbon group in which two carbon atoms not adjacent to each other among carbon atoms constituting an alicyclic ring are bonded by a bond chain containing one or more carbon atoms.

Among them, the alicyclic hydrocarbon group is preferably a substituted or unsubstituted monocyclic alicyclic group having 3 to 10 carbon atoms or a substituted or unsubstituted polycyclic alicyclic group having 6 to 14 carbon atoms. Thereby, the formability of an intramolecular hydrogen bond between the carboxylic acid anion and the sulfanyl group, the diffusion length controllability of the compound (1') itself, and the solubility in a solvent, and the like can be exhibited at high levels.

Examples of the monovalent aromatic hydrocarbon group having 6 to 20 carbon atoms include aryl groups such as a phenyl group, a tolyl group, a xylyl group, a naphthyl group, and an anthryl group; and aralkyl groups such as a benzyl group, a phenethyl group, and a naphthylmethyl group.

Examples of the heterocyclic cyclic hydrocarbon group include a group obtained by removing one hydrogen atom from an aromatic heterocyclic structure and a group obtained by removing one hydrogen atom from an alicyclic heterocyclic structure. A 5-membered aromatic structure having aromaticity by introducing a hetero atom is also included in the heterocyclic structure. Examples of the hetero atom include an oxygen atom, a nitrogen atom, and a sulfur atom. The heterocyclic cyclic hydrocarbon group also includes a lactone structure, a cyclic carbonate structure, and a sultone structure and the like.

Examples of the aromatic heterocyclic structure include:
oxygen atom-containing aromatic heterocyclic structures such as furan, pyran, benzofuran, and benzopyran;
nitrogen atom-containing aromatic heterocyclic structures such as pyrrole, imidazole, pyridine, pyrimidine, pyrazine, indole, quinoline, isoquinoline, acridine, phenazine, and carbazole;
sulfur atom-containing aromatic heterocyclic structure such as thiophene; and
aromatic heterocyclic structures containing a plurality of heteroatoms, such as thiazole, benzothiazole, thiazine, and oxazine.

Examples of the alicyclic heterocyclic structure include:
oxygen atom-containing alicyclic heterocyclic structures such as oxirane, tetrahydrofuran, tetrahydropyran, dioxolane, and dioxane;
nitrogen atom-containing alicyclic heterocyclic structures such as aziridine, pyrrolidine, piperidine, and piperazine;
sulfur atom-containing alicyclic heterocyclic structures such as thietane, thiolane, and thiane; and
alicyclic heterocyclic structures containing a plurality of heteroatoms, such as morpholine, 1,2-oxathiolane, and 1,3-oxathiolane.

Examples of the lactone structure, cyclic carbonate structure, and sultone structure include structures represented by the following formulas (H-1) to (H-9).

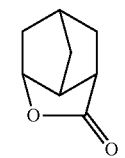
(H-1)

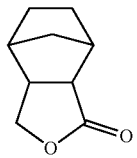
(H-2)

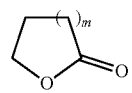
(H-3)

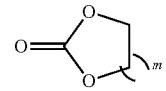
(H-4)

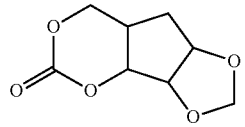
(H-5)

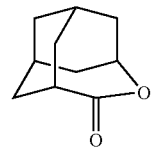
(H-6)

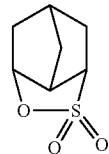
(H-7)

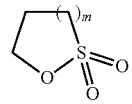
(H-8)

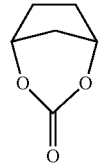
(H-9)

In the above formulas, m is an integer of 1 to 3.

In the formula (1'), α and β are preferably the same number in consideration of the formability of an intramolecular hydrogen bond between the carboxylic acid anion and the sulfanyl group.

Specific examples of the structure of the anion moiety in the formula (1') include structures below.

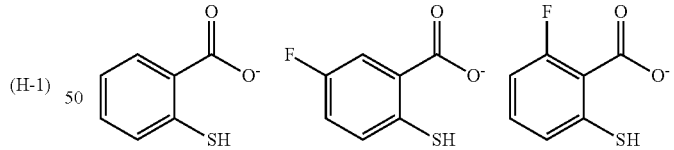
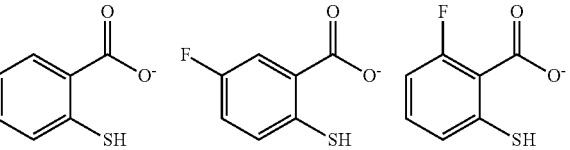
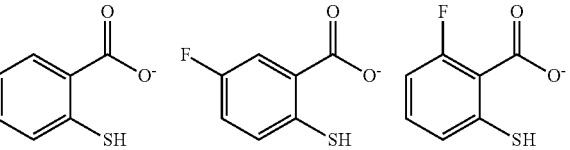

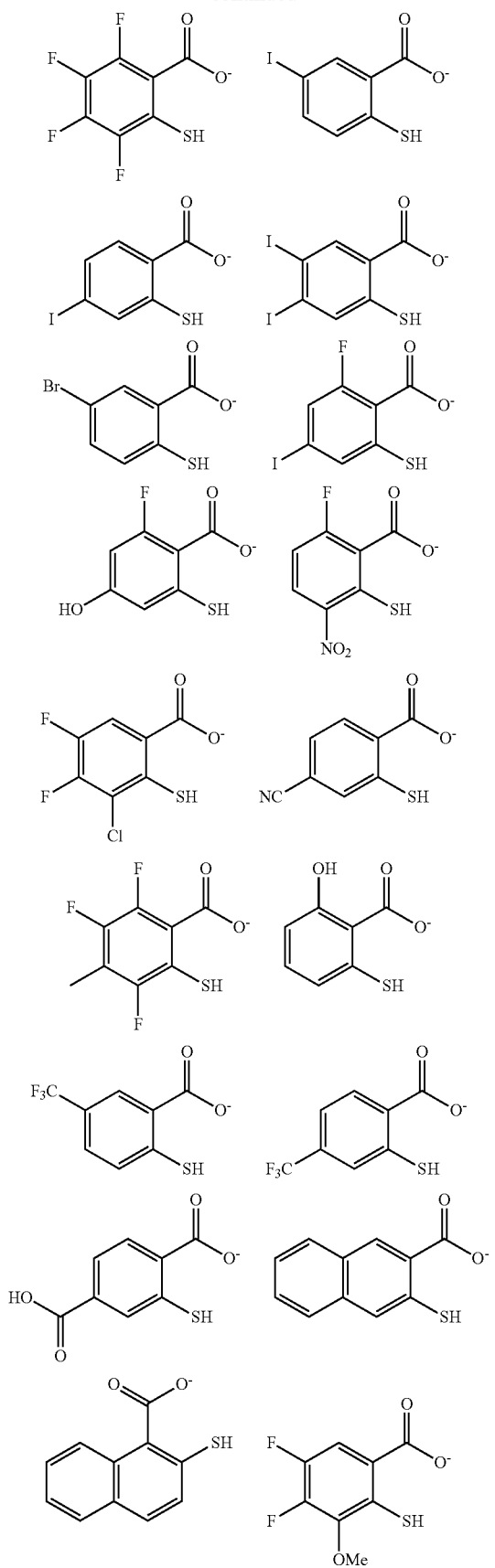
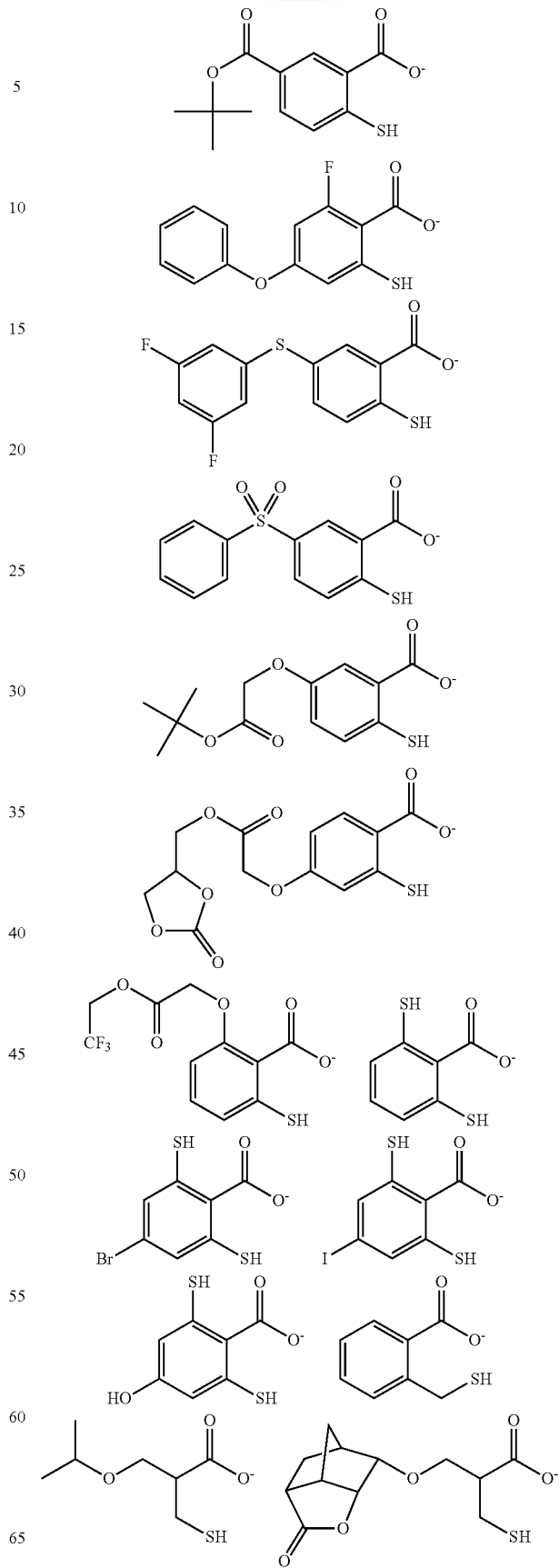

-continued

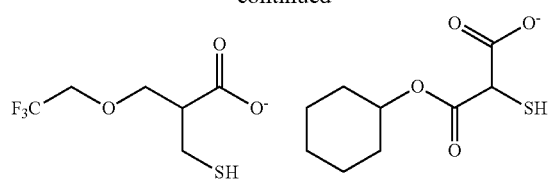

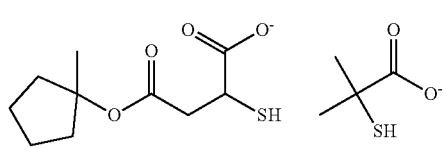

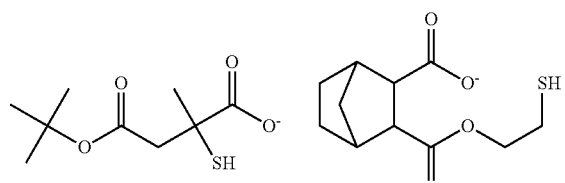

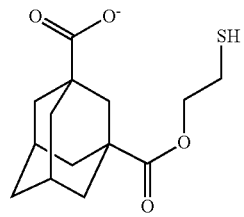

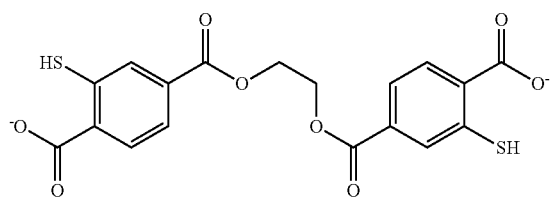

An example of the monovalent radiation-sensitive onium cation is a radioactive ray-degradable onium cation containing an element such as S, I, O, N, P, Cl, Br, F, As, Se, Sn, Sb, Te, or Bi. Examples of such a radioactive ray-degradable onium cation include a sulfonium cation, a tetrahydrothiophenium cation, a iodonium cation, a phosphonium cation, a diazonium cation, and a pyridinium cation. Among them, a sulfonium cation or a iodonium cation is preferred. The sulfonium cation or the iodonium cation is preferably represented by any of the following formulas (X-1) to (X-6).

(X-1)

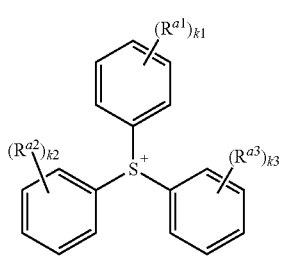

-continued (X-2)

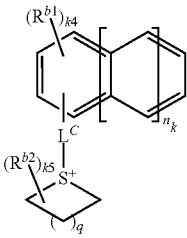

(X-3)

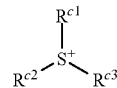

(X-4)

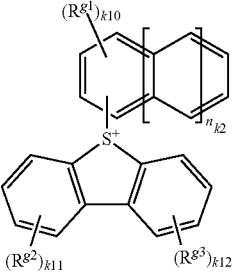

(X-5)

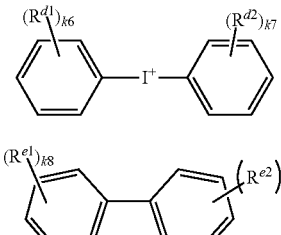

(X-6)

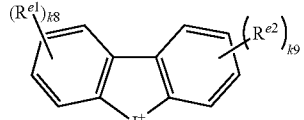

In the above formula (X-1), $R^{a1}$, $R^{a2}$ and $R^{a3}$ are each independently a substituted or unsubstituted, straight or branched chain alkyl group, alkoxy group or alkoxycarbonyloxy group having a carbon number of 1 to 12; a substituted or unsubstituted, monocyclic or polycyclic cycloalkyl group having a carbon number of 3 to 12; a substituted or unsubstituted aromatic hydrocarbon group having a carbon number of 6 to 12; a hydroxy group, a halogen atom, —OSO$_2$—$R^P$, —SO$_2$—$R^Q$ or —S—$R^T$; or a ring structure obtained by combining two or more of these groups. The ring structure may contain heteroatoms such as O and S between the carbon-carbon bonds forming the skeleton. $R^P$, $R^Q$ and $R^T$ are each independently a substituted or unsubstituted, straight or branched chain alkyl group having a carbon number of 1 to 12; a substituted or unsubstituted alicyclic hydrocarbon group having a carbon number of 5 to 25; and a substituted or unsubstituted aromatic hydrocarbon group having a carbon number of 6 to 12. k1, k2 and k3 are each independently an integer of 0 to 5. When there are a plurality of $R^{a1}$ to $R^{a3}$ and a plurality of $R^P$, $R^Q$ and $R^T$, a plurality of $R^{a1}$ to $R^{a3}$ and a plurality of $R^P$, $R^Q$ and $R^T$ may be each identical or different.

In the above formula (X-2), $R^{b1}$ is a substituted or unsubstituted, straight chain or branched alkyl group or alkoxy group having a carbon number of 1 to 20; a substituted or unsubstituted acyl group having a carbon number of 2 to 8; or a substituted or unsubstituted aromatic hydrocarbon group having a carbon number of 6 to 8; or a hydroxy group. $n_k$ is 0 or 1. When $n_k$ is 0, k4 is an integer of 0 to 4. When $n_k$ is 1, k4 is an integer of 0 to 7. When there are a plurality of $R^{b1}$, a plurality of $R^{b1}$ may be each identical or different. A plurality of $R^{b1}$ may represent a ring structure obtained by combining them. $R^{b2}$ is a substituted or unsubstituted, straight chain or branched alkyl group having a carbon number of 1 to 7; or a substituted or unsubstituted aromatic hydrocarbon group having a carbon number of 6 or 7. $L^C$ is a single bond or divalent linking group. k5 is an integer of 0 to 4. When there are a plurality of $R^{b2}$, a plurality of $R^{b2}$ may be each identical or different. A plurality of $R^{b2}$ may represent a ring structure obtained by combining them. q is an integer of 0 to 3. In the formula, the ring structure containing $S^+$ may contain a heteroatom such as O or S between the carbon-carbon bonds forming the skeleton.

In the above formula (X-3), $R^{c1}$, $R^{c2}$ and $R^{c3}$ are each independently a substituted or unsubstituted, straight or branched chain alkyl group having a carbon number of 1 to 12.

In the above formula (X-4), $R^{g1}$ is a substituted or unsubstituted linear or branched alkyl or alkoxy group having 1 to 20 carbon atoms, a substituted or unsubstituted acyl group having 2 to 8 carbon atoms, a substituted or unsubstituted aromatic hydrocarbon group having 6 to 8 carbon atoms, or a hydroxy group. $n_k$ is 0 or 1. When $n_{k2}$ is 0, k10 is an integer of 0 to 4, and when $n_{k2}$ is 1, k10 is an integer of 0 to 7. When there are two or more $R^{g1}$s, the two or more $R^{g1}$s are the same or different from each other, and may represent a cyclic structure formed by combining them together. $R^{g2}$ and $R^{g3}$ are each independently a substituted or unsubstituted linear or branched alkyl, alkoxy, or alkoxycarbonyloxy group having 1 to 12 carbon atoms, a substituted or unsubstituted monocyclic or polycyclic cycloalkyl group having 3 to 12 carbon atoms, a substituted or unsubstituted aromatic hydrocarbon group having 6 to 12 carbon atoms, a hydroxyl group, a halogen atom, or a ring structure formed by combining two or more of these groups together. K11 and k12 are each independently an integer of 0 to 4. When there are two or more $R^{g2}$s and two or more $R^{g3}$s, the two or more $R^{g2}$s may be the same or different from each other, and the two or more $R^{g3}$s may be the same or different from each other.

In the above formula (X-5), $R^{d1}$ and $R^{d2}$ are each independently a substituted or unsubstituted, straight or branched chain alkyl group, alkoxy group or alkoxycarbonyl group having a carbon number of 1 to 12; a substituted or unsubstituted aromatic hydrocarbon group having a carbon number of 6 to 12; a halogen atom; a halogenated alkyl group having a carbon number of 1 to 4; a nitro group; or a ring structure obtained by combining two or more of these groups. k6 and k7 are each independently an integer of 0 to 5. When there are a plurality of $R^{d1}$ and a plurality of $R^{d2}$, a plurality of $R^{d1}$ and a plurality of $R^{d2}$ may be each identical or different.

In the above formula (X-6), $R^{e1}$ and $R^{e2}$ are each independently a halogen atom; a substituted or unsubstituted straight or branched chain alkyl group having a carbon number of 1 to 12; or a substituted or unsubstituted aromatic hydrocarbon group having a carbon number of 6 to 12. k8 and k9 are each independently an integer of 0 to 4.

Specific examples of the structure of the radiation-sensitive onium cation include the following structures and the like.

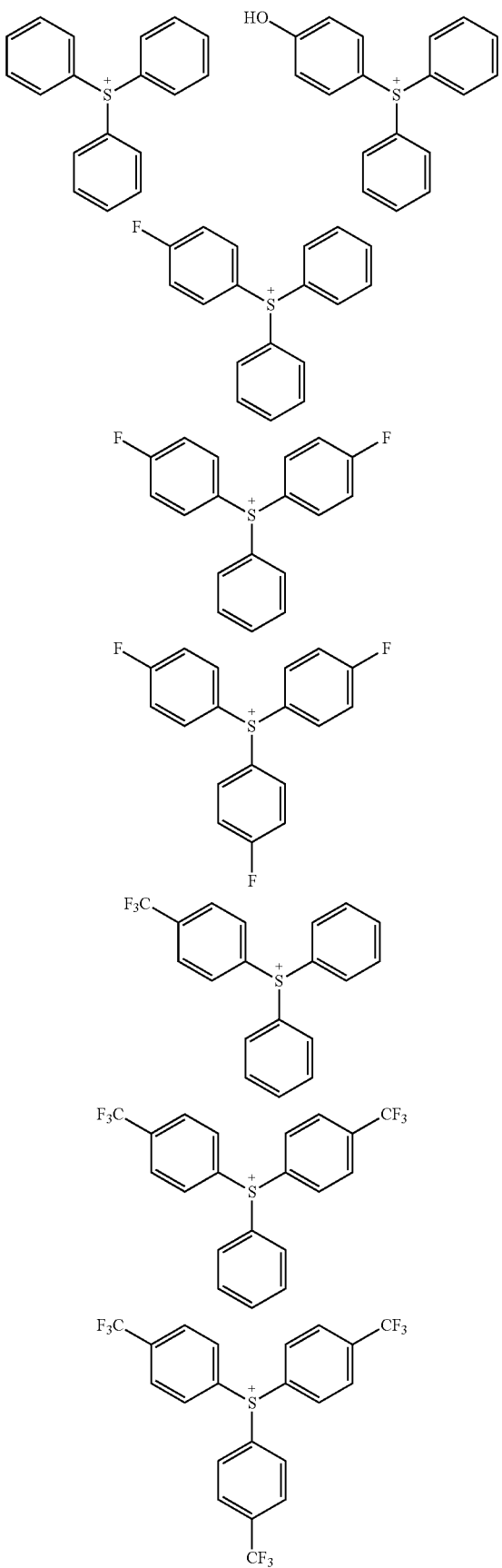

-continued
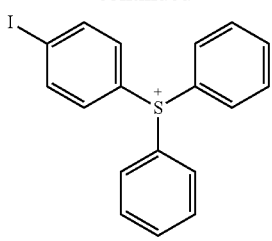
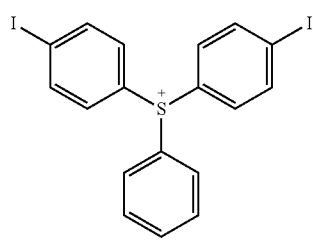
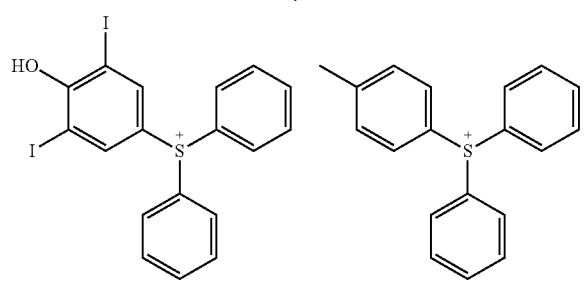
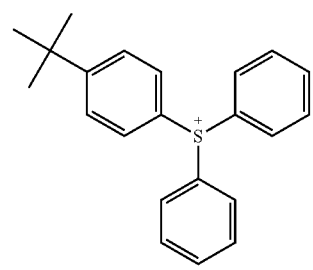
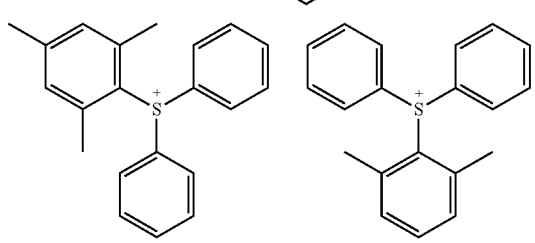
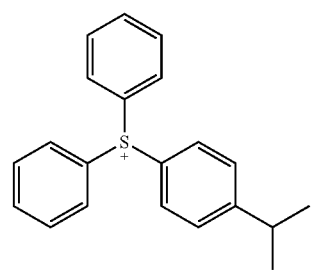
-continued
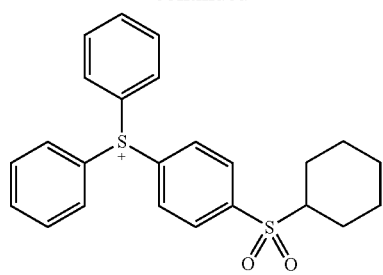
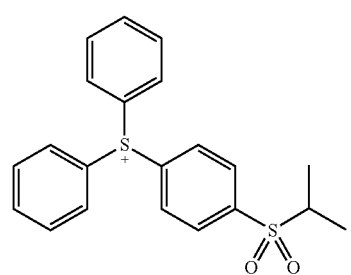
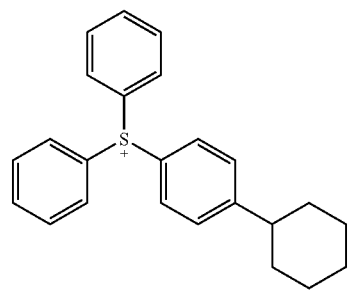
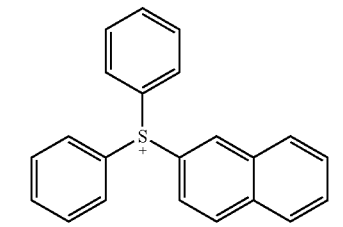
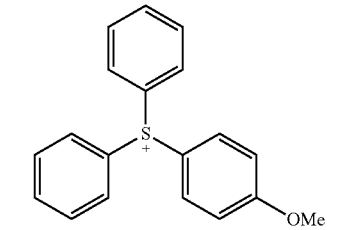
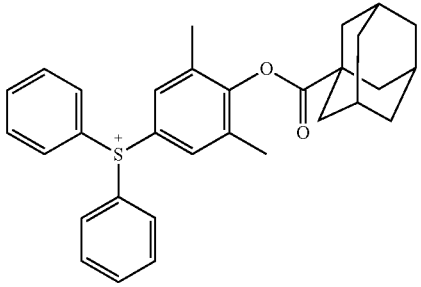

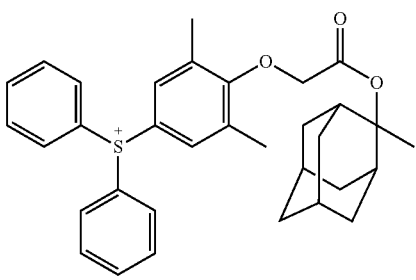

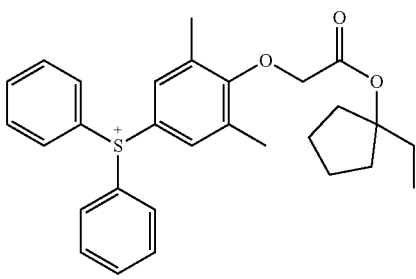

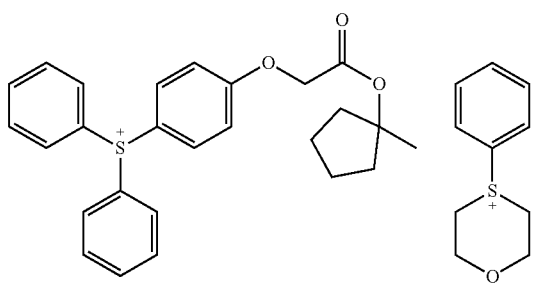

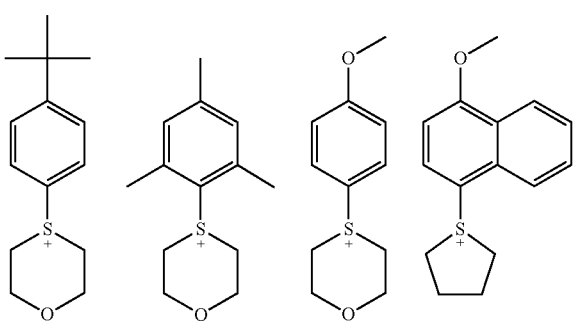

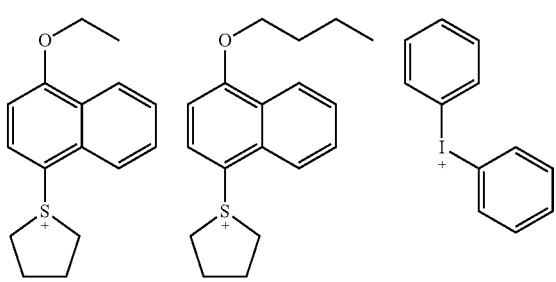

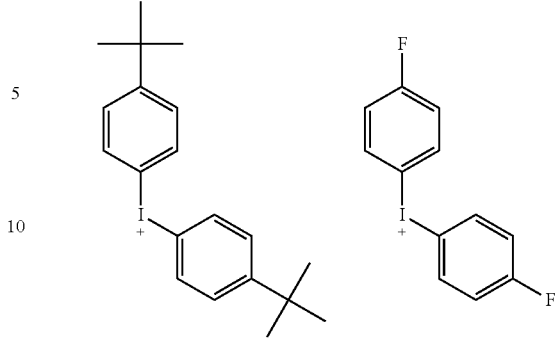

The onium salt compound represented by the above formula (1') is preferably an onium salt compound represented by formula (1) below (hereinafter, also referred to as "compound (1)") from viewpoints of the formability of an intramolecular hydrogen bond between a carboxylic acid anion and a sulfanyl group, the easiness of synthesis, and the capturability of a generated acid, and the like.

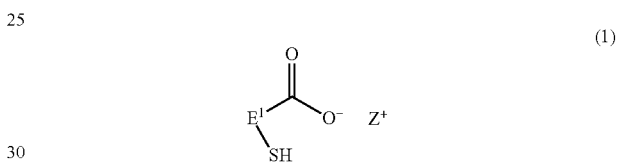

(1)

(In the above formula (1), $E^1$ is a substituted or unsubstituted divalent organic group having 1 to 40 carbon atoms.

$Z^+$ have the same meanings as those in the above formula (1').)

Examples of the substituted or unsubstituted divalent organic group having 1 to 40 carbon atoms represented by $E^1$ include a group corresponding to a divalent group among the substituted or unsubstituted $(\alpha+\beta)$-valent organic groups having 1 to 40 carbon atoms represented by $E^4$ in the above formula (1').

Part or all of hydrogen atoms on carbon atoms in $E^4$ or $E^1$ are preferably substituted with a halogen atom or a halogenated alkyl group. Due to the electron-withdrawing properties of these groups, the carboxylic acid anion is stabilized, whereby the basicity of the compound (1') or the compound (1) is lowered, which makes it possible to improve various resist performances such as sensitivity. In particular, it is preferable that the above $E^4$ or $E^1$ contains an aromatic ring structure, and part or all of hydrogen atoms of the aromatic ring structure are substituted with a halogen atom or a halogenated alkyl group.

The minimum number of atoms in the above $E^4$ or $E^1$ connecting the carbon atom (carbonyl carbon) of the carbonyl group in the carboxylic acid anion bonded to the above $E^4$ or $E^1$ and the sulfur atom of the sulfanyl group bonded to the above $E^4$ or $E^1$ is preferably 1 to 6. As a result, a 5 to 10-membered intramolecular hydrogen bond is easily generated by the carboxylic acid anion and the sulfanyl group, and a resist performance improving action due to the decrease in the basicity of the compound (1') or the compound (1) can be efficiently exhibited. When there are two sets of combinations of a carboxylic acid anion and a sulfanyl group, the minimum number of the connecting atoms is preferably satisfied in each combination.

In a method for counting the minimum number of the connecting atoms, for example, the number of atoms present in the shortest path connecting the carbon atom (carbonyl carbon) of the carbonyl group in the carboxylic acid anion and the sulfur atom of the sulfanyl group (between C and S) is counted as 2 (two carbon atoms) in formula (ex1) below, and the number of atoms present in the shortest path connecting C and S is counted as 3 (two carbon atoms and one oxygen atom) in formula (ex2) below.

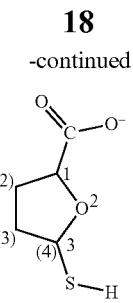
(ex2)

Meanwhile, in the above formula (ex2), in the case of the path of each atom to which the number with parentheses is added, the number of atoms between C and S is 4, and the path is not the shortest path. The atom present in the shortest path is not limited to the carbon atom, and may be the oxygen atom as shown in the above formula (ex2), another heteroatom, or a combination of a plurality of kinds of atoms. The bond present in the shortest path may be any of a single bond, a double bond, a triple bond, or a combination thereof.

Specific suitable examples of the compound (1') or the compound (1) include formulas (1-1) to (1-31) below.

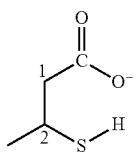
(ex1)

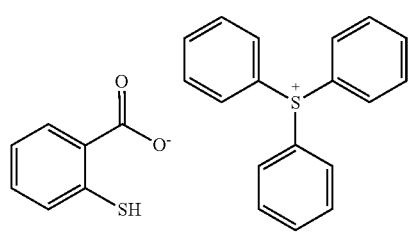
(1-1)

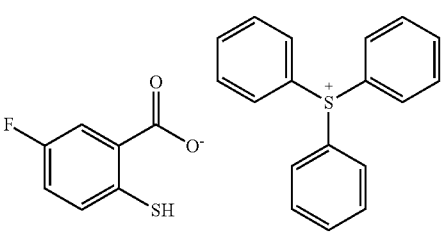
(1-2)

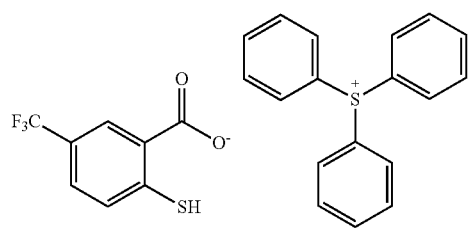
(1-3)

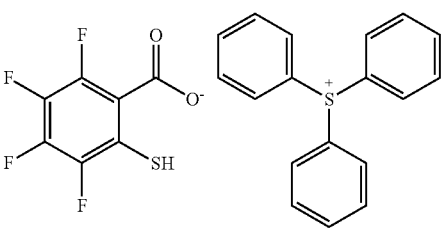
(1-4)

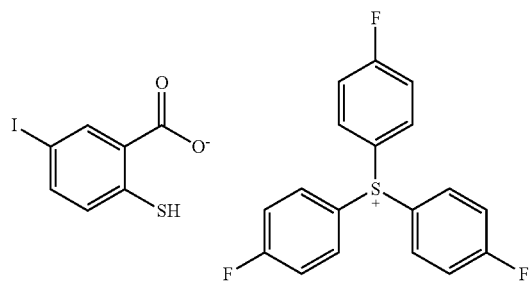
(1-5)

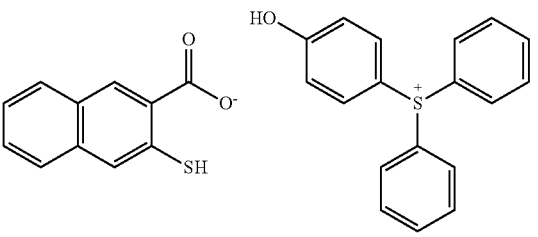
(1-6)

-continued
(1-7)
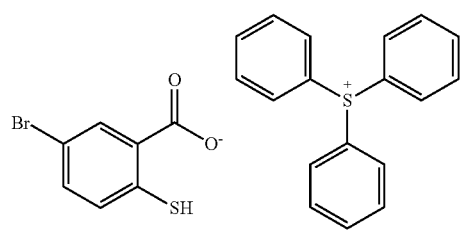
(1-8)
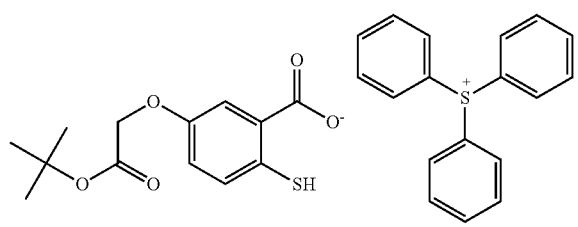
(1-9)
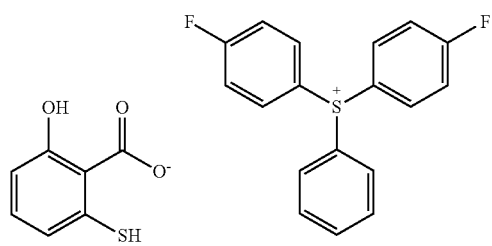
(1-10)
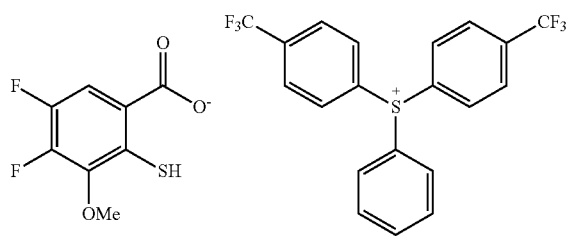
(1-11)
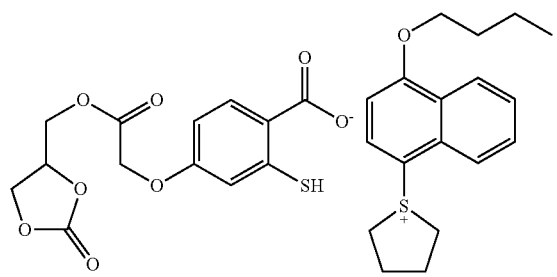
(1-12)
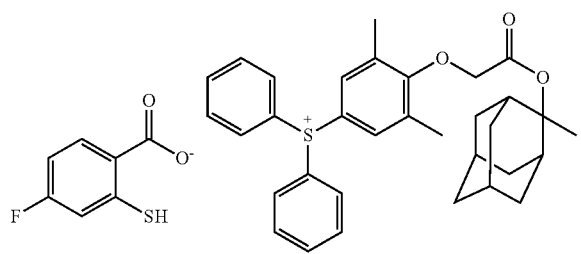
(1-13)
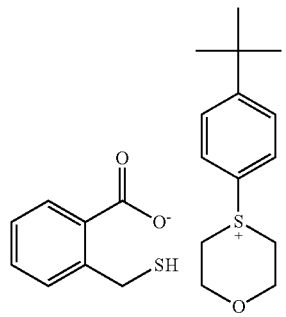
(1-14)
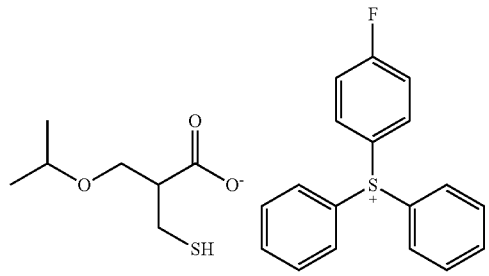
(1-15)
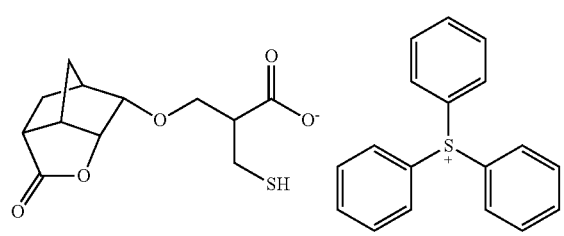
(1-16)
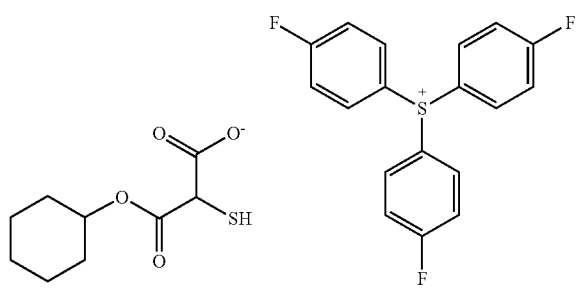

-continued
(1-17)
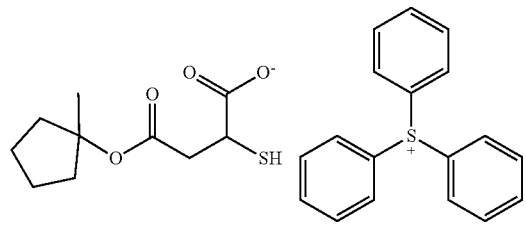
(1-18)
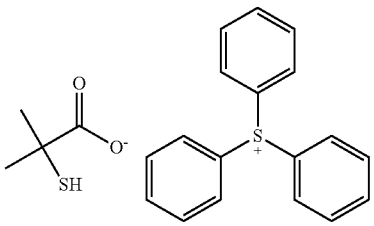
(1-19)
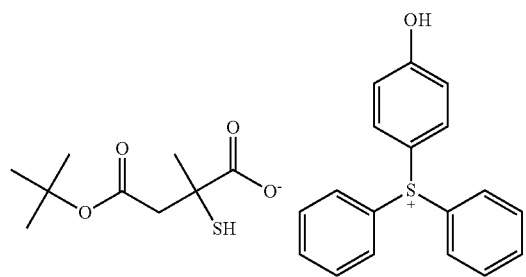
(1-20)
(1-21)
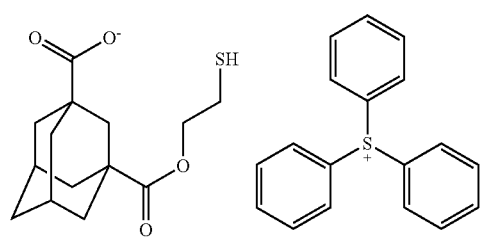
(1-22)
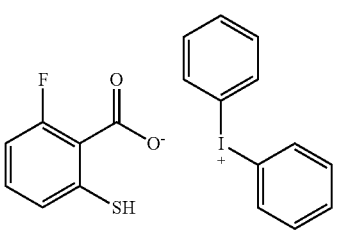
(1-24)
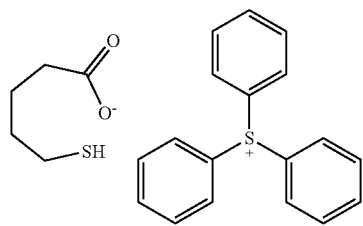
(1-25)
(1-26)
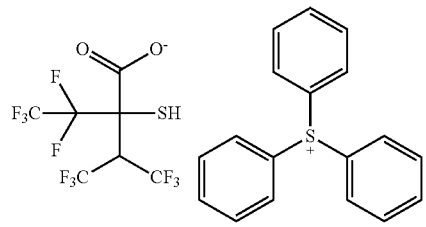
(1-27)
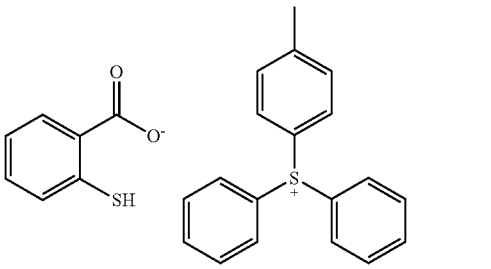
(1-28)
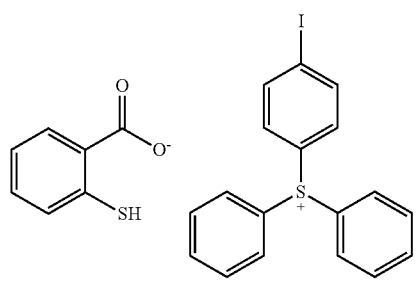

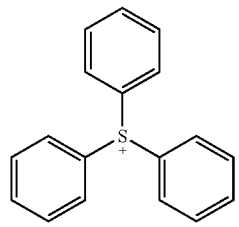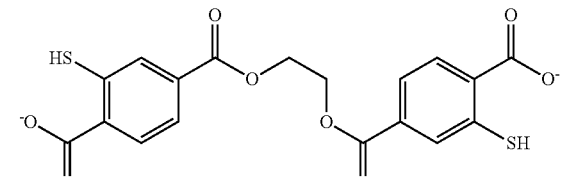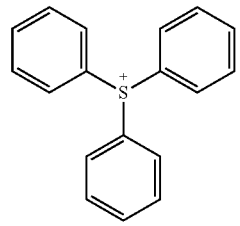

(1-29)

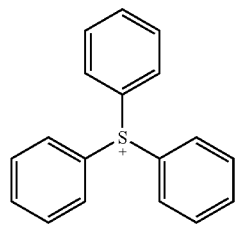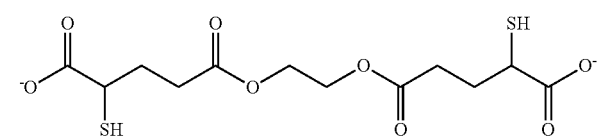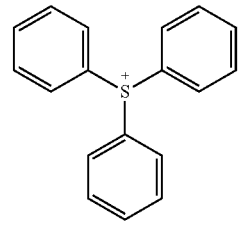

(1-30)

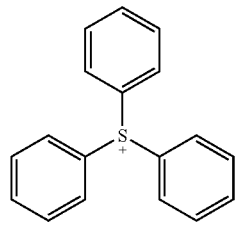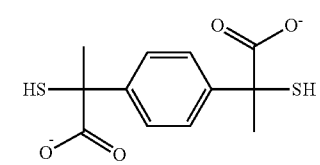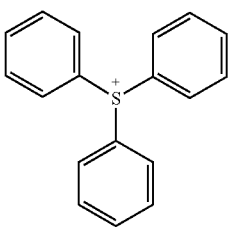

(1-31)

Among them, the compounds (1') represented by the above formulas (1-1) to (1-22) and (1-29) are preferable.

The content of the compound (1') in the radiation-sensitive resin composition according to the present embodiment is preferably 0.01 parts by mass or more and 30 parts by mass or less with respect to 100 parts by mass of the resin described later. The upper limit of the content is more preferably 25 parts by mass, still more preferably 20 parts by mass, particularly preferably 15 parts by mass. The lower limit of the content is more preferably 0.1 part by mass, still more preferably 0.2 parts by mass. The content of the compound (1') is appropriately selected according to the type of resin to be used, exposure conditions, required sensitivity, and the type and content of the radiation-sensitive acid generator described later. This makes it possible to exhibit excellent sensitivity, CDU performance, and LWR performance in the formation of the resist pattern.

(Synthesis Method of Compound (1'))

The compound (1) as the compound (1') can be typically synthesized according to the following scheme.

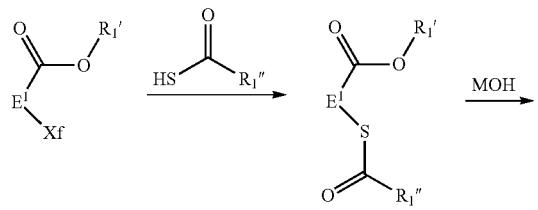

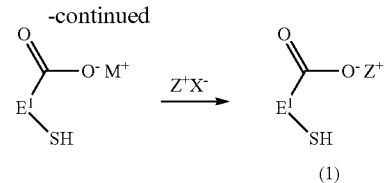

(In the formula, $E^1$ and $Z^+$ have the same meanings as those in the above formula (1). $R_1'$ and $R_1''$ each are an alkyl group. Xf is a halogen atom. M is an alkali metal. $X^-$ is a halide ion. The halogen atoms in Xf and $X^-$ are the same or different.)

An ester derivative having an ester structure and a halogen atom at positions corresponding to the respective introduction positions of a carboxylic acid anion and a sulfanyl group in the anion moiety of the compound (1) is reacted with a thiocarboxylic acid to produce an acyl sulfide body. Next, an alkali metal salt derivative having a sulfanyl group is produced by hydrolysis with an alkali. The finally obtained alkali metal salt derivative is reacted with an onium cation halide corresponding to the onium cation moiety to promote salt exchange, whereby the target compound (1) can be synthesized. When there are two carboxylic acid anions and two sulfanyl groups in the formula (1'), the compound (1') can be synthesized by using a diester body having two ester structures and two halogen atoms in the molecule as a starting material and advancing the subsequent steps along the above scheme. Similarly, the compound (1') and the compound (1) having other structures can be synthesized by appropriately selecting precursors corresponding to the anion moiety and the onium cation moiety.

(Resin)

The resin is an aggregate of polymers having a structural unit (hereinafter, also referred to as "structural unit (I)") containing an acid-dissociable group (hereinafter, this resin is also referred to as "base resin"). The "acid-dissociable group" refers to a group that substitutes for a hydrogen atom of a carboxy group, a phenolic hydroxyl group, an alcoholic hydroxyl group, a sulfo group, or the like, and is dissociated by the action of an acid. The radiation-sensitive resin composition is excellent in pattern-forming performance because the resin has the structural unit (I).

In addition to the structural unit (I), the base resin preferably has a structural unit (II) containing at least one selected from the group consisting of a lactone structure, a cyclic carbonate structure, and a sultone structure described later, and may have another structural unit other than the structural units (I) and (II). Each of the structural units will be described below.

[Structural Unit (I)]

The structural unit (I) contains an acid-dissociable group. The structural unit (I) is not particularly limited as long as it contains an acid-dissociable group. Examples of such a structural unit (I) include a structural unit having a tertiary alkyl ester moiety, a structural unit having a structure obtained by substituting the hydrogen atom of a phenolic hydroxyl group with a tertiary alkyl group, and a structural unit having an acetal bond. From the viewpoint of improving the pattern-forming performance of the radiation-sensitive resin composition, a structural unit represented by the following formula (2) (hereinafter also referred to as a "structural unit (I-1)") is preferred.

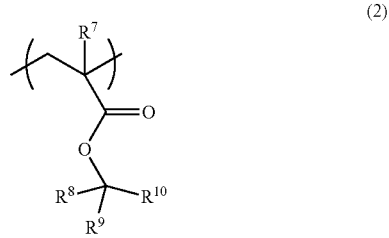

(2)

(In the above formula (2), $R^7$ is a hydrogen atom, a fluorine atom, a methyl group, or a trifluoromethyl group, $R^8$ is a monovalent hydrocarbon group having 1 to 20 carbon atoms, $R^9$ and $R^{10}$ are each independently a monovalent chain hydrocarbon group having 1 to 10 carbon atoms or a monovalent alicyclic hydrocarbon group having 3 to 20 carbon atoms or represent a divalent alicyclic group having 3 to 20 carbon atoms formed by these groups combined together and a carbon atom to which they are bonded.

From the viewpoint of copolymerizability of a monomer that will give the structural unit (I-1), $R^7$ is preferably a hydrogen atom or a methyl group, more preferably a methyl group.

Examples of the monovalent hydrocarbon group having 1 to 20 carbon atoms represented by $R^8$ include a chain hydrocarbon group having 1 to 10 carbon atoms, a monovalent alicyclic hydrocarbon group having 3 to 20 carbon atoms, and a monovalent aromatic hydrocarbon group having 6 to 20 carbon atoms.

Examples of the chain hydrocarbon groups having 1 to 10 carbon atoms represented by $R^8$ to $R^{10}$ include linear or branched saturated hydrocarbon groups having 1 to 10 carbon atoms and linear or branched unsaturated hydrocarbon groups having 1 to 10 carbon atoms.

Examples of the alicyclic hydrocarbon groups having 3 to 20 carbon atoms represented by $R^8$ to $R^{10}$ include monocyclic or polycyclic saturated hydrocarbon groups and monocyclic or polycyclic unsaturated hydrocarbon groups. Preferred examples of the monocyclic saturated hydrocarbon groups include a cyclopentyl group, a cyclohexyl group, a cycloheptyl group, and a cyclooctyl group. Preferred examples of the polycyclic saturated hydrocarbon groups include bridged alicyclic hydrocarbon groups such as a norbornyl group, an adamantyl group, a tricyclodecyl group, and a tetracyclododecyl group. It is to be noted that the bridged alicyclic hydrocarbon group refers to a polycyclic alicyclic hydrocarbon group in which two carbon atoms that constitute an alicyclic ring and not adjacent to each other are bonded by a bonding chain containing at least one carbon atom.

Examples of the monovalent aromatic hydrocarbon group having 6 to 20 carbon atoms represented by $R^8$ include: aryl groups such as a phenyl group, a tolyl group, a xylyl group, a naphthyl group, and an anthryl group; and aralkyl groups such as a benzyl group, a phenethyl group, and a naphthylmethyl group.

$R^8$ is preferably a linear or branched saturated hydrocarbon group having 1 to 10 carbon atoms or an alicyclic hydrocarbon group having 3 to 20 carbon atoms.

The divalent alicyclic group having 3 to 20 carbon atoms formed by $R^9$ and $R^{10}$ combined together and a carbon atom to which a chain hydrocarbon group or an alicyclic hydrocarbon group represented by $R^9$ and a chain hydrocarbon group or an alicyclic hydrocarbon group represented by $R^{10}$ are bonded is not particularly limited as long as it is a group obtained by removing two hydrogen atoms from the same carbon atom constituting a carbon ring of a monocyclic or polycyclic alicyclic hydrocarbon having the above-described carbon number. The divalent alicyclic group having 3 to 20 carbon atoms may either be a monocyclic hydrocarbon group or a polycyclic hydrocarbon group. The polycyclic hydrocarbon group may either be a bridged alicyclic hydrocarbon group or a condensed alicyclic hydrocarbon group and may either be a saturated hydrocarbon group or an unsaturated hydrocarbon group. It is to be noted that the condensed alicyclic hydrocarbon group refers to a polycyclic alicyclic hydrocarbon group in which two or more alicyclic rings share their sides (bond between two adjacent carbon atoms).

When the monocyclic alicyclic hydrocarbon group is a saturated hydrocarbon group, preferred examples thereof include a cyclopentanediyl group, a cyclohexanediyl group, a cycloheptanediyl group, and a cyclooctanediyl group. When the monocyclic alicyclic hydrocarbon group is an unsaturated hydrocarbon group, preferred examples thereof include a cyclopentenediyl group, a cyclohexenediyl group, a cycloheptenediyl group, a cyclooctenediyl group, and a cyclodecenediyl group. The polycyclic alicyclic hydrocarbon group is preferably a bridged alicyclic saturated hydrocarbon group, and preferred examples thereof include a bicyclo[2.2.1]heptane-2,2-diyl group (norbornane-2,2-diyl group), a bicyclo[2.2.2]octane-2,2-diyl group, and a tricyclo[3.3.1.1$^{3,7}$]decane-2,2-diyl group (adamantane-2,2-diyl group).

Among them, $R^8$ is preferably an alkyl group having 1 to 4 carbon atoms, and the alicyclic structure formed by $R^9$ and $R^{10}$ combined together and a carbon atom to which they are bonded is preferably a polycyclic or monocyclic cycloalkane structure.

Examples of the structural unit (I-1) include structural units represented by the following formulas (3-1) to (3-6) (hereinafter also referred to as "structural units (I-1-1) to (I-1-6)").

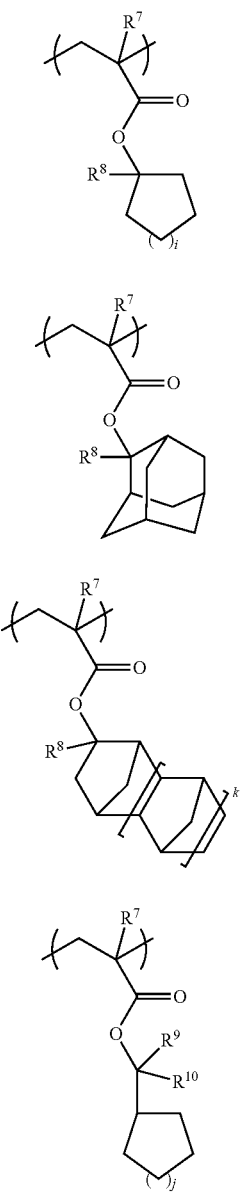

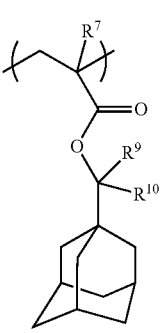

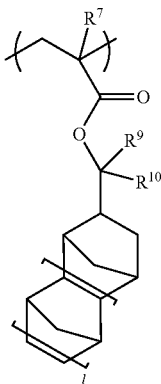

-continued

In the above formulas (3-1) to (3-6), $R^7$ to $R^{10}$ have the same meaning as in the above formula (2), i and j are each independently an integer of 1 to 4, and k and l are each 0 or 1.

In the above formulas (3-1) to (3-6), i and j are preferably 1, and $R^8$ is preferably a methyl group, an ethyl group, or an isopropyl group. $R^9$ and $R^{10}$ are each preferably a methyl group, or an ethyl group The base resin may contain one type or a combination of two or more types of the structural units (I).

The lower limit of the content (total content, if multiple types are included) of the structural unit (I) is preferably 10 mol %, more preferably 15 mol %, even more preferably 20 mol %, particularly preferably 30 mol % with respect to the total amount of the structural units constituting the base resin. The upper limit of the content is preferably 80 mol %, more preferably 70 mol %, even more preferably 65 mol %, particularly preferably 60 mol %. When the content of the structural unit (I) is set to fall within the above range, the pattern-forming performance of the radiation-sensitive resin composition can further be improved.

[Structural Unit (II)]

The structural unit (II) is a structural unit including at least one selected from the group consisting of a lactone structure, a cyclic carbonate structure and a sultone structure. The solubility of the base resin into a developer can be adjusted by further introducing the structural unit (II). As a result, the radiation-sensitive resin composition can provide improved lithography properties such as the resolution. The adhesion between a resist pattern formed from the base resin and a substrate can also be improved.

Examples of the structural unit (II) include structural units represented by the following formulae (T-1) to (T-10)

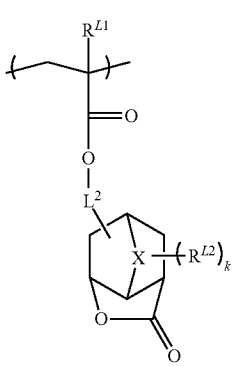

(T-2) 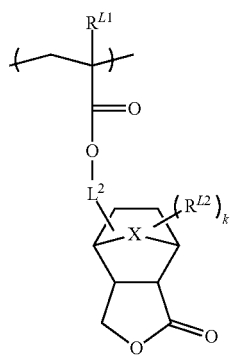

(T-3) 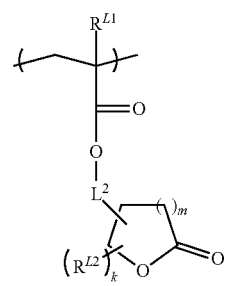

(T-4) 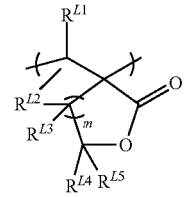

(T-5) 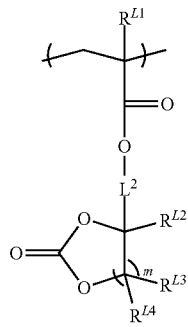

(T-6) 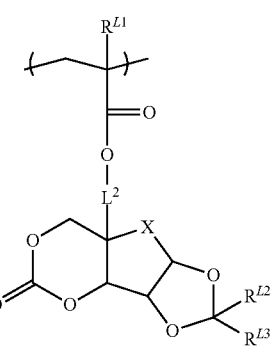

(T-7) 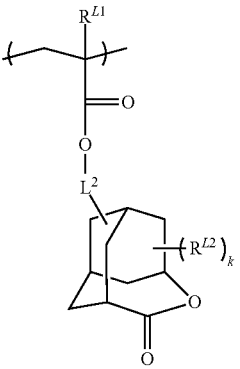

(T-8) 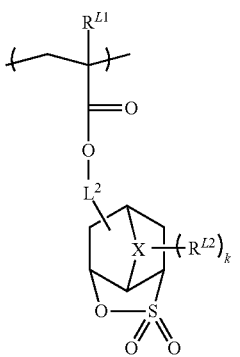

(T-9) 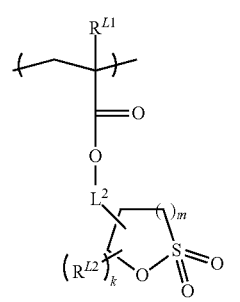

(T-10) 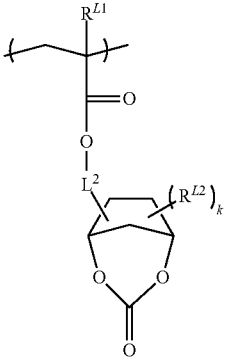

In the above formulae, $R^{L1}$ is a hydrogen atom, a fluorine atom, a methyl group, or a trifluoromethyl group; $R^{L2}$ to $R^{L5}$ are each independently a hydrogen atom, an alkyl group having a carbon number of 1 to 4, a cyano group, a trifluoromethyl group, a methoxy group, a methoxycarbonyl group, a hydroxy group, a hydroxymethyl group, or a dimethylamino group; $R^{L4}$ and $R^{L5}$ may be a divalent alicyclic group having a carbon number of 3 to 8, which is obtained by combining $R^{L4}$ and $R^{L5}$ with the carbon atom to which they are bound. $L^2$ is a single bond, or a divalent linking group; X is an oxygen atom or a methylene group; k is an integer of 0 to 3; and m is an integer of 1 to 3.

Example of the divalent alicyclic group having a carbon number of 3 to 8, which is composed of a combination of $R^{L4}$ and $R^{L5}$ with the carbon atom to which they are bound, includes the divalent alicyclic group having a carbon number of 3 to 8 in the divalent alicyclic group having a carbon number of 3 to 20, which is composed of a combination of the chain hydrocarbon group or the alicyclic hydrocarbon group represented by $R^9$ and $R^{10}$ in the above formula (2) with the carbon atom to which they are bound. One or more hydrogen atoms on the alicyclic group may be substituted with a hydroxy group.

Examples of the divalent linking group represented by $L^2$ as described above include a divalent straight or branched chain hydrocarbon group having a carbon number of 1 to 10; a divalent alicyclic hydrocarbon group having a carbon number of 4 to 12; and a group composed of one or more of the hydrocarbon group thereof and at least one group of —CO—, —O—, —NH— and —S—.

Among them, the structural unit (II) is preferably a group having a lactone structure, more preferably a group having a norbornane lactone structure, and further preferably a group derived from a norbornane lactone-yl (meth)acrylate.

The lower limit of the content by percent of the structural unit (II) is preferably 20 mol %, more preferably 25 mol %, and further preferably 30 mol % based on the total structural units as the component of the base resin. The upper limit of the content by percent is preferably 80 mol %, more preferably 75 mol %, and further preferably 70 mol %. By adjusting the content by percent of the structural unit D within the ranges, the radiation-sensitive resin composition can provide improved lithography properties such as the resolution. The adhesion between the formed resist pattern and the substrate can also be improved.

[Structural Unit (III)]

The base resin optionally has another structural unit in addition to the structural units (I) and (II). Another structural unit includes a structural unit (III) containing a polar group (excluding those corresponding to the structural unit (II)). When the base resin further has a structural unit (III), solubility in the developer can be adjusted. As a result, lithographic performance such as resolution of the radiation-sensitive resin composition can be improved. Examples of the polar group include a hydroxy group, a carboxy group, a cyano group, a nitro group, and a sulfonamide group. Among them, a hydroxy group and a carboxy group are preferable, and a hydroxy group is more preferable.

Examples of the structural unit (III) include structural units represented by the following formulas.

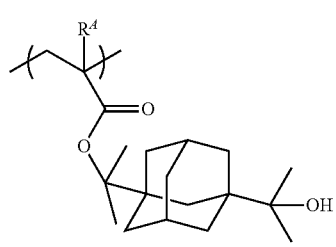

-continued

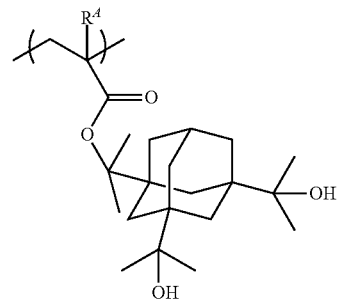

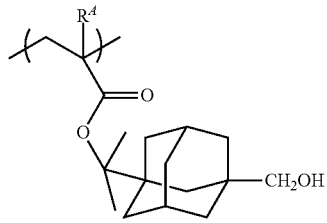

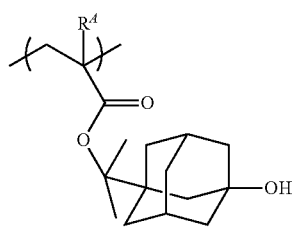 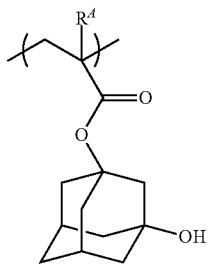

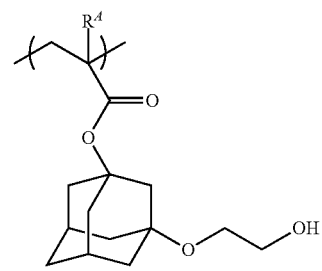

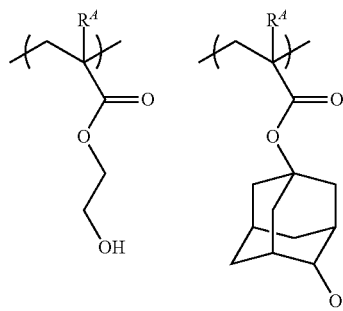

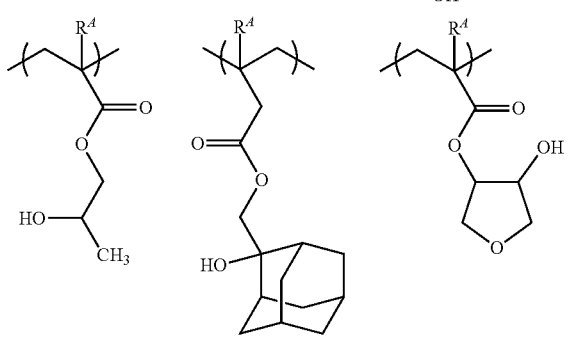

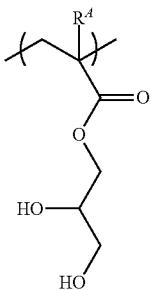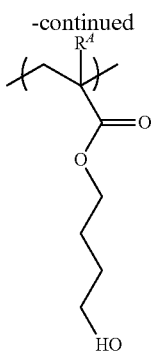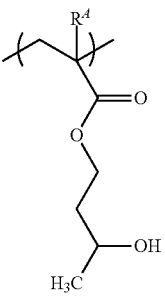

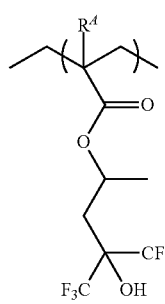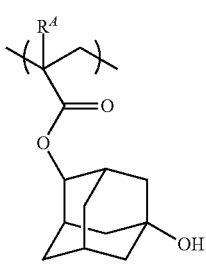

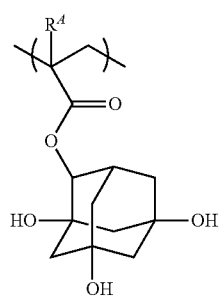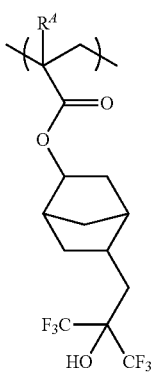

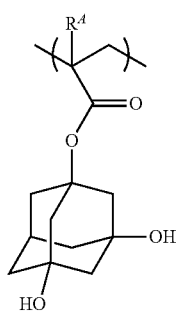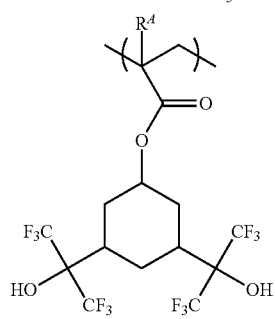

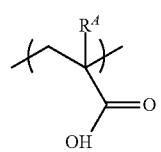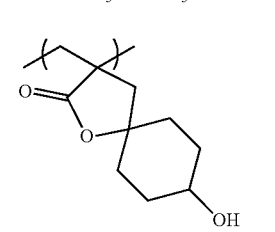

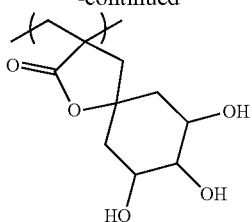

In the above formulas, $R^A$ is a hydrogen atom, a fluorine atom, a methyl group, or a trifluoromethyl group.

When the resin includes the structural unit (III) having a polar group, the lower limit of the content of the structural unit (III) with respect to the total amount of the structural units constituting the resin is preferably 5 mol %, more preferably 8 mol %, even more preferably 10 mol %. The upper limit of the content is preferably 40 mol %, more preferably 35 mol %, even more preferably 30 mol %. When the content of the structural unit having a polar group is set to fall within the above range, the radiation-sensitive resin composition can provide further improved lithography properties such as the resolution.

[Structural Unit (IV)]

The base resin optionally has, as another structural unit, a structural unit derived from hydroxystyrene or a structural unit having a phenolic hydroxyl group (hereinafter, both are also collectively referred to as "structural unit (IV)"), in addition to the structural unit (III) having a polar group. The structural unit (IV) contributes to an improvement in etching resistance and an improvement in a difference in solubility of a developer (dissolution contrast) between an exposed part and a non-exposed part. In particular, the structural unit (IV) can be suitably applied to pattern formation using exposure with a radioactive ray having a wavelength of 50 nm or less, such as an electron beam or EUV. In this case, the resin preferably has the structural unit (I) together with the structural unit (IV).

In this case, it is preferable to obtain the structural unit (IV) by performing polymerization in a state in which the phenolic hydroxyl group is protected by a protective group such as an alkali-dissociable group during polymerization, and then performing deprotection by hydrolysis. The structural unit that provides the structural unit (IV) by hydrolysis is preferably represented by the following formulas (4-1) and (4-2).

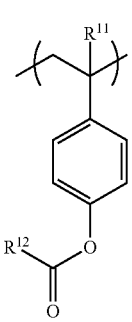

(4-1)

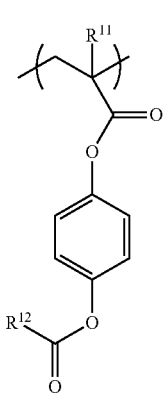

(4-2)

In the above formulas (4-1) and (4-2), $R^{11}$ is a hydrogen atom, a fluorine atom, a methyl group, or a trifluoromethyl group, and $R^{12}$ is a monovalent hydrocarbon group having 1 to 20 carbon atoms or an alkoxy group. Examples of the monovalent hydrocarbon group having 1 to 20 carbon atoms for $R^{12}$ include monovalent hydrocarbon groups having 1 to 20 carbon atoms for $R^8$ in the structural unit (I). Examples of the alkoxy group include a methoxy group, an ethoxy group, and a tert-butoxy group.

As $R^{12}$, an alkyl group and an alkoxy group are preferable, and among them, a methyl group and a tert-butoxy group are more preferable.

In the case of a resin for exposure with a radioactive ray having a wavelength of 50 nm or less, the lower limit of the content of the structural unit (IV) is preferably 10 mol %, more preferably 20 mol %, with respect to the total amount of structural units constituting the resin. The upper limit of the content is preferably 70 mol %, more preferably 60 mol %.

(Synthesis Method of Base Resin)

For example, the base resin can be synthesized by performing a polymerization reaction of each monomer for providing each structural unit with a radical polymerization initiator or the like in a suitable solvent.

Examples of the radical polymerization initiator include an azo-based radical initiator, including azobisisobutyronitrile (AIBN), 2,2'-azobis(4-methoxy-2,4-dimethylvaleronitrile), 2,2'-azobis(2-cyclopropylpropanenitrile), 2,2'-azobis(2,4-dimethylvaleronitrile), and dimethyl 2,2'-azobisisobutyrate; and peroxide-based radical initiator, including benzoyl peroxide, t-butyl hydroperoxide, and cumene hydroperoxide. Among them, AIBN or dimethyl 2,2'-azobisisobutyrate is preferred, and AIBN is more preferred. The radical initiator may be used alone, or two or more radical initiators may be used in combination.

Examples of the solvent used for the polymerization reaction include
  alkanes including n-pentane, n-hexane, n-heptane, n-octane, n-nonane, and n-decane;
  cycloalkanes including cyclohexane, cycloheptane, cyclooctane, decalin, and norbornane;
  aromatic hydrocarbons including benzene, toluene, xylene, ethylbenzene, and cumene;
  halogenated hydrocarbons including chlorobutanes, bromohexanes, dichloroethanes, hexamethylenedibromide, and chlorobenzenes;
  saturated carboxylate esters, including ethyl acetate, n-butyl acetate, i-butyl acetate, and methyl propionate;
  ketones including acetone, methyl ethylketone, 4-methyl-2-pentanone, and 2-heptanone;
  ethers including tetrahydrofuran, dimethoxyethanes, and diethoxyethanes; and
  alcohols including methanol, ethanol, 1-propanol, 2-propanol, and 4-methyl-2-pentanol. The solvent used for the polymerization reaction may be used alone, or two or more solvents may be used in combination.

The reaction temperature of the polymerization reaction is typically from 40° C. to 150° C., and preferably from 50° C. to 120° C. The reaction time is typically from 1 hour to 48 hours, and preferably from 1 hour to 24 hours.

The molecular weight of the base resin is not particularly limited, but the polystyrene-equivalent weight average molecular weight (Mw) measured by gel permeation chromatography (GPC) is preferably 1,000 or more and 50,000 or less, more preferably 2,000 or more and 30,000 or less, still more preferably 3,000 or more and 15,000 or less, particularly preferably 4,000 or more and 12,000 or less. When the Mw of the base resin is less than the lower limit, the heat resistance of the resulting resist film may be deteriorated. When the Mw of the base resin exceeds the above upper limit, the developability of the resist film may be deteriorated.

For the base resin as a base resin, the ratio of Mw to the number average molecular weight (Mn) as determined by GPC relative to standard polystyrene (Mw/Mn) is typically not less than 1 and not more than 5, preferably not less than 1 and not more than 3, and more preferably not less than 1 and not more than 2.

The Mw and Mn of the resin in the specification are amounts measured by using Gel Permeation Chromatography (GPC) with the condition as described below.
  GPC column: two G2000HXL, one G3000HXL, and one G4000HXL (all manufactured from Tosoh Corporation)
  Column temperature: 40° C.
  Eluting solvent: tetrahydrofuran
  Flow rate: 1.0 mL/min
  Sample concentration: 1.0% by mass
  Sample injection amount: 100 μL
  Detector: Differential Refractometer
  Reference material: monodisperse polystyrene The content of the base resin is preferably not less than 70% by mass, more preferably not less than 80% by mass, and further preferably not less than 85% by mass based on the total solid content of the radiation-sensitive resin composition.

<Another Resin>

The radiation-sensitive resin composition according to the present embodiment may contain, as another resin, a resin having higher content by mass of fluorine atoms than the above-described base resin (hereinafter, also referred to as a "high fluorine-content resin"). When the radiation-sensitive resin composition contains the high fluorine-content resin, the high fluorine-content resin can be localized in the surface layer of a resist film compared to the base resin, which as a result makes it possible to enhance the water repellency of the surface of the resist film during immersion exposure.

The high fluorine-content resin preferably has, for example, a structural unit represented by the following formula (5) (hereinafter, also referred to as "structural unit (V)"), and may have the structural unit (I) or the structural unit (II) in the base resin as necessary.

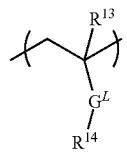

(5)

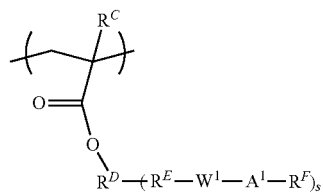

(f-2)

In the above formula (5), $R^{13}$ is a hydrogen atom, a methyl group, or a trifluoromethyl group; GL is a single bond, an oxygen atom, a sulfur atom, —COO—, —SO$_2$ONH—, —CONH—, or —OCONH—; $R^{14}$ is a monovalent fluorinated chain hydrocarbon group having a carbon number of 1 to 20, or a monovalent fluorinated alicyclic hydrocarbon group having a carbon number of 3 to 20.

As $R^{13}$ as described above, in terms of the copolymerizability of monomers resulting in the structural unit (V), a hydrogen atom or a methyl group is preferred, and a methyl group is more preferred.

As GL as described above, in terms of the copolymerizability of monomers resulting in the structural unit (V), a single bond or —COO— is preferred, and —COO— is more preferred.

Example of the monovalent fluorinated chain hydrocarbon group having a carbon number of 1 to 20 represented by $R^{14}$ as described above includes a group in which a part of or all of hydrogen atoms in the straight or branched chain alkyl group having a carbon number of 1 to 20 is/are substituted with a fluorine atom.

Example of the monovalent fluorinated alicyclic hydrocarbon group having a carbon number of 3 to 20 represented by $R^{14}$ as described above includes a group in which a part of or all of hydrogen atoms in the monocyclic or polycyclic hydrocarbon group having a carbon number of 3 to 20 is/are substituted with a fluorine atom.

The $R^{14}$ as described above is preferably a fluorinated chain hydrocarbon group, more preferably a fluorinated alkyl group, and further preferably 2,2,2-trifluoroethyl group, 1,1,1,3,3,3-hexafluoropropyl group and 5,5,5-trifluoro-1,1-diethylpentyl group.

When the high fluorine-content resin has the structural unit (V), the lower limit of the content of the structural unit (V) is preferably 30 mol %, more preferably 35 mol %, even more preferably 40 mol %, particularly preferably 45 mol % with respect to the total amount of all the structural units constituting the high fluorine-content resin. The upper limit of the content is preferably 90 mol %, more preferably 85 mol %, even more preferably 80 mol %. When the content of the structural unit (V) is set to fall within the above range, the content by mass of fluorine atoms of the high fluorine-content resin can more appropriately be adjusted to further promote the localization of the high fluorine-content resin in the surface layer of a resist film, as a result, the water repellency of the resist film during immersion exposure can be further improved.

The high fluorine-content resin may have a fluorine atom-containing structural unit represented by the following formula (f-2) (hereinafter, also referred to as a "structural unit (VI)") in addition to or in place of the structural unit (V). When the high fluorine-content resin has the structural unit (VI), solubility in an alkaline developing solution is improved, and therefore generation of development defects can be prevented.

The structural unit (VI) is classified into two groups: a unit having an alkali soluble group (x); and a unit having a group (y) in which the solubility into the alkaline developing solution is increased by the dissociation by alkali (hereinafter, simply referred as an "alkali-dissociable group"). In both cases of (x) and (y), $R^C$ in the above formula (f-2) is a hydrogen atom, a fluorine atom, a methyl group, or a trifluoromethyl group; $R^D$ is a single bond, a hydrocarbon group having a carbon number of 1 to 20 with the valency of (s+1), a structure in which an oxygen atom, a sulfur atom, —NR$^{dd}$—, a carbonyl group, —COO— or —CONH— is connected to the terminal on $R^E$ side of the hydrocarbon group, or a structure in which a part of hydrogen atoms in the hydrocarbon group is substituted with an organic group having a hetero atom; $R^{dd}$ is a hydrogen atom, or a monovalent hydrocarbon group having a carbon number of 1 to 10; and s is an integer of 1 to 3.

When the structural unit (VI) has the alkali soluble group (x), $R^F$ is a hydrogen atom; $A^1$ is an oxygen atom, —COO—* or —SO$_2$O—*; * refers to a bond to $R^F$; $W^1$ is a single bond, a hydrocarbon group having a carbon number of 1 to 20, or a divalent fluorinated hydrocarbon group. When $A^1$ is an oxygen atom, $W^1$ is a fluorinated hydrocarbon group having a fluorine atom or a fluoroalkyl group on the carbon atom connecting to $A^1$. $R^E$ is a single bond, or a divalent organic group having a carbon number of 1 to 20. When s is 2 or 3, a plurality of $R^E$, $W^1$, $A^1$ and $R^F$ may be each identical or different. The affinity of the high fluorine-content resin into the alkaline developing solution can be improved by including the structural unit (VI) having the alkali soluble group (x), and thereby prevent from generating the development defect. As the structural unit (VI) having the alkali soluble group (x), particularly preferred is a structural unit in which $A^1$ is an oxygen atom and $W^1$ is a 1,1,1,3,3,3-hexafluoro-2,2-methanediyl group.

When the structural unit (VI) has the alkali-dissociable group (y), $R^F$ is a monovalent organic group having carbon number of 1 to 30; $A^1$ is an oxygen atom, —NR$^{aa}$—, —COO—*, or —SO$_2$O—*; $R^{aa}$ is a hydrogen atom, or a monovalent hydrocarbon group having a carbon number of 1 to 10; * refers to a bond to $R^F$; $W^1$ is a single bond, or a divalent fluorinated hydrocarbon group having a carbon number of 1 to 20; $R^E$ is a single bond, or a divalent organic group having a carbon number of 1 to 20. When $A^1$ is —COO—* or —SO$_2$O—*, $W^1$ or $R^F$ has a fluorine atom on the carbon atom connecting to $A^1$ or on the carbon atom adjacent to the carbon atom. When $A^1$ is an oxygen atom, $W^1$ and $R^E$ are a single bond; $R^D$ is a structure in which a carbonyl group is connected at the terminal on $R^E$ side of the hydrocarbon group having a carbon number of 1 to 20; and $R^F$ is an organic group having a fluorine atom. When s is 2 or 3, a plurality of $R^E$, $W^1$, $A^1$ and $R^F$ may be each identical or different. The surface of the resist film is changed from hydrophobic to hydrophilic in the alkaline developing step by including the structural unit (VI) having the alkali-dissociable group (y). As a result, the affinity of the high fluorine-content resin into the alkaline developing solution can be significantly improved, and thereby prevent from generating the development defect more efficiently. As the structural unit (VI) having the alkali-dissociable group (y), particularly preferred is a structural unit in which $A^1$ is —COO—*, and $R^F$ or $W^1$, or both is/are a fluorine atom.

In terms of the copolymerizability of monomers resulting in the structural unit (VI), $R^C$ is preferably a hydrogen atom or a methyl group, and more preferably a methyl group.

When $R^E$ is a divalent organic group, $R^E$ is preferably a group having a lactone structure, more preferably a group having a polycyclic lactone structure, and further preferably a group having a norbornane lactone structure.

When the high fluorine-content resin has the structural unit (VI), the lower limit of the content of the structural unit (VI) is preferably 40 mol %, more preferably 50 mol %, even more preferably 60 mol % with respect to the total amount of all the structural units constituting the high fluorine-content resin. The upper limit of the content is preferably 95 mol %, more preferably 90 mol %, even more preferably 85 mol %. When the content of the structural unit (VI) is set to fall within the above range, water repellency of a resist film during immersion exposure can further be improved.

The lower limit of Mw of the high fluorine-content resin is preferably 1,000, more preferably 2,000, further preferably 3,000, and particularly preferably 5,000. The upper limit of Mw is preferably 50,000, more preferably 30,000, further preferably 20,000, and particularly preferably 15,000.

The lower limit of the Mw/Mn of the high fluorine-content resin is typically 1, and more preferably 1.1. The upper limit of the Mw/Mn is typically 5, preferably 3, more preferably 2, and further preferably 1.9.

The lower limit of the content of the high fluorine-content resin is preferably 0.1% by mass, more preferably 0.5% by mass, further preferably 1% by mass, and even further preferably 1.5% by mass based on the total solid content of the radiation-sensitive resin composition. The upper limit of the content is preferably 20% by mass, more preferably 15% by mass, further preferably 10% by mass, and particularly preferably 7% by mass.

The lower limit of the content of the high fluorine-content resin is preferably 0.1 part by mass, more preferably 0.5 part by mass, further preferably 1 part by mass, and particularly preferably 1.5 part by mass based on 100 parts by mass of total base resins. The upper limit of the content is preferably 15 parts by mass, more preferably 10 parts by mass, further preferably 8 parts by mass, and particularly preferably 5 parts by mass.

When the content of the high fluorine-content resin is set to fall within the above range, the high fluorine-content resin can more effectively be localized in the surface layer of a resist film, which as a result makes it possible to further enhance the water repellency of the surface of the resist film during liquid immersion lithography. The radiation-sensitive resin composition may contain one kind of high fluorine-content resin or two or more kinds of high fluorine-content resins.

(Method for Synthesizing High Fluorine-Content Resin)

The high fluorine-content resin can be synthesized by a method similar to the above-described method for synthesizing a base resin.

(Radiation-Sensitive Acid Generator)

The radiation-sensitive resin composition of the present embodiment preferably further contains a radiation-sensitive acid generator that generates an acid having a pKa smaller than that of the acid generated from the compound (1') (including the compound (1)) by exposure, that is, a relatively strong acid. When the resin contains the structural unit (I) having an acid-dissociable group, the acid generated from the radiation-sensitive acid generator by exposure can dissociate the acid-dissociable group of the structural unit (I) to generate a carboxy group or the like. This function is different from the function of the compound (1') that suppresses the diffusion of the acid generated from the radiation-sensitive acid generator in the non-exposed part without substantially dissociating the acid-dissociable group or the like of the structural unit (I) or the like of the resin under the pattern formation condition using the radiation-sensitive resin composition. Each function of the compound (1') and the radiation-sensitive acid generator depends on energy required for the dissociation of the acid-dissociable group of the structural unit (I) or the like of the resin, and heat energy conditions applied when a pattern is formed using the radiation-sensitive resin composition, and the like. The containing mode of the radiation-sensitive acid generator in the radiation-sensitive resin composition may be a mode in which the radiation-sensitive acid generator is present alone as a compound (released from a polymer), a mode in which the radiation-sensitive acid generator is incorporated as a part of a polymer, or both of these forms, but a mode in which the radiation-sensitive acid generator is present alone as a compound is preferable.

When the radiation-sensitive resin composition contains the radiation-sensitive acid generator, the polarity of the resin in the exposed part increases, whereby the resin in the exposed part is soluble in the developer in the case of alkaline aqueous solution development, and is poorly soluble in the developer in the case of organic solvent development.

Examples of the radiation-sensitive acid generator include an onium salt compound (excluding the compound (1')), a sulfonimide compound, a halogen-containing compound, and a diazoketone compound. Examples of the onium salt compound include a sulfonium salt, a tetrahydrothiophenium salt, an iodonium salt, a phosphonium salt, a diazonium salt, and a pyridinium salt. Among them, a sulfonium salt and an iodonium salt are preferable.

Examples of the acid generated during exposure include acids that generate sulfonic acid during exposure. Examples of such an acid include a compound in which the carbon atom adjacent to the sulfo group is substituted with one or more fluorine atoms or fluorinated hydrocarbon groups. Among them, as the radiation-sensitive acid generator, a radiation-sensitive acid generator having a cyclic structure is particularly preferable.

These radiation-sensitive acid generators may be used alone or in combination of two or more thereof. The lower limit of the content of the radiation-sensitive acid generator is preferably 0.1 part by mass, more preferably 1 part by mass, and still more preferably 5 parts by mass, with respect to 100 parts by mass of the base resin. The upper limit of the content is preferably 40 parts by mass, more preferably 35 parts by mass, still more preferably 30 parts by mass, and particularly preferably 20 parts by mass with respect to 100 parts by mass of the resin. As a result, excellent sensitivity, CDU performance, and LWR performance can be exhibited when forming a resist pattern.

<Solvent>

The radiation-sensitive resin composition according to the present embodiment contains a solvent. The solvent is not particularly limited as long as it can dissolve or disperse at least the resin, the radiation-sensitive acid generator, and an additive or the like contained if necessary.

Examples of the solvent include an alcohol-based solvent, an ether-based solvent, a ketone-based solvent, an amide-based solvent, an ester-based solvent, and a hydrocarbon-based solvent.

Examples of the alcohol-based solvent include:
a monoalcohol-based solvent having a carbon number of 1 to 18, including iso-propanol, 4-methyl-2-pentanol, 3-methoxybutanol, n-hexanol, 2-ethylhexanol, furfuryl alcohol, cyclohexanol, 3,3,5-trimethylcyclohexanol, and diacetone alcohol;
a polyhydric alcohol having a carbon number of 2 to 18, including ethylene glycol, 1,2-propylene glycol, 2-methyl-2,4-pentanediol, 2,5-hexanediol, diethylene glycol, dipropylene glycol, triethylene glycol, and tripropylene glycol; and
a partially etherized polyhydric alcohol-based solvent in which a part of hydroxy groups in the polyhydric alcohol-based solvent is etherized.

Examples of the ether-based solvent include:
a dialkyl ether-based solvent, including diethyl ether, dipropyl ether, and dibutyl ether;
a cyclic ether-based solvent, including tetrahydrofuran and tetrahydropyran;
an ether-based solvent having an aromatic ring, including diphenylether and anisole (methyl phenyl ether); and
an etherized polyhydric alcohol-based solvent in which a hydroxy group in the polyhydric alcohol-based solvent is etherized.

Examples of the ketone-based solvent include:
a chain ketone-based solvent, including acetone, butanone, and methyl-iso-butyl ketone;
a cyclic ketone-based solvent, including cyclopentanone, cyclohexanone, and methylcyclohexanone; and
2,4-pentanedione, acetonylacetone, and acetophenone.

Examples of the amide-based solvent include:
a cyclic amide-based solvent, including N,N'-dimethyl imidazolidinone and N-methylpyrrolidone; and
a chain amide-based solvent, including N-methylformamide, N,N-dimethylformamide, N,N-diethylformamide, acetamide, N-methylacetamide, N,N-dimethylacetamide, and N-methylpropionamide.

Examples of the ester-based solvent include:
a monocarboxylate ester-based solvent, including n-butyl acetate and ethyl lactate;
a partially etherized polyhydric alcohol acetate-based solvent, including diethylene glycol mono-n-butyl ether acetate, propylene glycol monomethyl ether acetate, and dipropylene glycol monomethyl ether acetate;
a lactone-based solvent, including γ-butyrolactone and valerolactone;
a carbonate-based solvent, including diethyl carbonate, ethylene carbonate, and propylene carbonate; and
a polyhydric carboxylic acid diester-based solvent, including propylene glycol diacetate, methoxy triglycol acetate, diethyl oxalate, ethyl acetoacetate, ethyl lactate, and diethyl phthalate.

Examples of the hydrocarbon-based solvent include:
an aliphatic hydrocarbon-based solvent, including n-hexane, cyclohexane, and methylcyclohexane;
an aromatic hydrocarbon-based solvent, including benzene, toluene, di-iso-propylbenzene, and n-amylnaphthalene.

Among them, the ester-based solvent or the ketone-based solvent is preferred. The partially etherized polyhydric alcohol acetate-based solvent, the cyclic ketone-based solvent, or the lactone-based solvent is more preferred. Propylene glycol monomethyl ether acetate, cyclohexanone, or γ-butyrolactone is still more preferred. The radiation-sensitive resin composition may include one type of the solvent, or two or more types of the solvents in combination.

<Other Optional Components>

The radiation-sensitive resin composition may contain other optional components other than the above-described components. Examples of other optional components include a cross-linking agent, a localization enhancing agent, a surfactant, an alicyclic backbone-containing compound, and a sensitizer. These other optional components may be used singly or in combination of two or more of them.

(Crosslinking Agent)

The crosslinking agent is a compound having two or more functional groups. The crosslinking agent causes a cross-linking reaction in the resin component by an acid catalytic reaction in the baking step after the collective exposure step to increase the molecular weight of the resin component, and thereby decreases the solubility of the pattern exposed part in the developer. Examples of the functional group include a (meth)acryloyl group, a hydroxymethyl group, an alkoxymethyl group, an epoxy group, and a vinyl ether group.

(Localization Enhancing Agent)

The localization enhancing agent has an effect of localizing the high fluorine-content resin on the surface of the resist film more effectively. The added amount of the high fluorine-content resin can be decreased compared to the traditionally added amount by including the localization enhancing agent in the radiation-sensitive resin composition. The localization enhancing agent can further prevent from eluting the ingredient of the composition from the resist film to an immersion medium and carry out the immersion exposure at higher speed with a high-speed scan, while maintaining the lithography properties of the radiation-sensitive resin composition. As a result, the hydrophobicity of the surface of the resist film can be improved, resulting in the prevention of the defect due to the immersion, for example, the watermark defect. Example of the compound which may be used as the localization enhancing agent includes a low molecular weight compound having a specific dielectric constant of not less than 30 and not more than 200 and a boiling point of 100° C. or more at 1 atm. Specific examples of the compound include a lactone compound, a carbonate compound, a nitrile compound, and a polyhydric alcohol.

Examples of the lactone compound include γ-butyrolactone, valerolactone, mevaloniclactone, and norbornane lactone.

Examples of the carbonate compound include propylene carbonate, ethylene carbonate, butylene carbonate, and vinylene carbonate.

Example of the nitrile compound includes succinonitrile.

Example of the polyhydric alcohol includes glycerine.

The lower limit of the content of the localization enhancing agent is preferably 10 parts by mass, more preferably 15 parts by mass, further preferably 20 parts by mass, and more further preferably 25 parts by mass based on 100 parts by mass of total resins in the radiation-sensitive resin composition. The upper limit of the content is preferably 300 parts by mass, more preferably 200 parts by mass, further preferably 100 parts by mass, and more further preferably 80 parts by mass. The radiation-sensitive resin composition may include one type of the localization enhancing agent, or two or more types of localization enhancing agents in combination.

(Surfactant)

The surfactant has an effect of improving the coating properties, the striation, and the developability of the composition. Examples of the surfactant include a nonionic surfactant, including polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate. Examples of the surfactant which is commercially available include KP341 (manufactured by Shin-Etsu Chemical Co., Ltd.), POLYFLOW No. 75, POLYFLOW No. 95 (all manufactured by Kyoeisha Chemical Co., Ltd.), EFTOP EF301, EFTOP EF303, EFTOP EF352 (all manufactured by Tokem Products), Megafac F171, Megafac F173 (all manufactured by DIC), Fluorad FC430, Fluorad FC431 (all manufactured by Sumitomo 3M Limited.), AsahiGuard AG710, Surflon S-382, Surflon SC-101, Surflon SC-102, Surflon SC-103, Surflon SC-104, Surflon SC-105, Surflon SC-106 (all manufactured by Asahi Glass Co., Ltd.). The content of the surfactant in the radiation-sensitive resin composition is typically not more than 2 parts by mass based on 100 parts by mass of total resins.

(Alicyclic Backbone-Containing Compound)

The alicyclic backbone-containing compound has an effect of improving the dry etching resistance, the shape of the pattern, the adhesiveness between the substrate, and the like.

Examples of the alicyclic backbone-containing compound include:

adamantane derivatives, including 1-adamantane carboxylic acid, 2-adamantanone, and t-butyl 1-adamantane carboxylate;

deoxycholic acid esters, including t-butyl deoxycholate, t-butoxycarbonylmethyl deoxycholate, and 2-ethoxyethyl deoxycholate;

lithocholic acid esters, including t-butyl lithocholate, t-butoxycarbonylmethyl lithocholate, and 2-ethoxyethyl lithocholate; and 3-[2-hydroxy-2,2-bis(trifluoromethyl)ethyl]tetracyclo[4.4.0.1(2,5).1(7,10)]dode cane, and 2-hydroxy-9-methoxycarbonyl-5-oxo-4-oxa-tricyclo[4.2.1.0(3,7)] nonane. The content of the alicyclic backbone-containing compound in the radiation-sensitive resin composition is typically not more than 5 parts by mass based on 100 parts by mass of total resins.

(Sensitizer)

The sensitizer shows an action of increasing the production of the acid, for example, from the radiation-sensitive acid generator, and has an effect of improving the "apparent sensitivity" of the radiation-sensitive resin composition.

Examples of the sensitizer include carbazoles, acetophenones, benzophenones, naphthalenes, phenols, biacetyl, eosin, rose bengal, pyrenes, anthracenes, and phenothiazines. The sensitizer may be used alone, or two or more sensitizers may be used in combination. The content of the sensitizer in the radiation-sensitive resin composition is typically not more than 2 parts by mass based on 100 parts by mass of total resins.

<Method for Preparing Radiation-Sensitive Resin Composition>

The radiation-sensitive resin composition can be prepared by, for example, mixing the compound (1'), the resin, the radiation-sensitive acid generator, and optionally the high fluorine-content resin, as well as the solvent added in a predetermined ratio. The radiation-sensitive resin composition is preferably filtered through, for example, a filter having a pore diameter of about 0.05 μm to 0.20 μm after mixing. The solid matter concentration of the radiation-sensitive resin composition is usually 0.1 mass % to 50 mass %, preferably 0.5 mass % to 30 mass %, more preferably 1 mass % to 20 mass %.

<Method for Forming Pattern>

A pattern forming method according to an embodiment of the present invention includes:

a step (1) of applying the radiation-sensitive resin composition directly or indirectly on a substrate to form a resist film (hereinafter, also referred to as a "resist film forming step");

a step (2) of exposing the resist film (hereinafter, also referred to as an "exposure step"); and a step (3) of developing the exposed resist film (hereinafter, also referred to as a "developing step").

The method for forming a pattern uses the above-described radiation-sensitive resin composition excellent in sensitivity in the exposure step, CDU performance, and LWR performance, and therefore a high-quality resist pattern can be formed. Hereinbelow, each of the steps will be described.

[Resist Film Forming Step]

In this step (the above mentioned step (1)), a resist film is formed with the radiation-sensitive resin composition. Examples of the substrate on which the resist film is formed include one traditionally known in the art, including a silicon wafer, silicon dioxide, and a wafer coated with aluminum. An organic or inorganic antireflection film may be formed on the substrate, as disclosed in JP-B-06-12452 and JP-A-59-93448. Examples of the applicating method include a rotary coating (spin coating), flow casting, and roll coating. After applicating, a prebake (PB) may be carried out in order to evaporate the solvent in the film, if needed. The temperature of PB is typically from 60° C. to 140° C., and preferably from 80° C. to 120° C. The duration of PB is typically from 5 seconds to 600 seconds, and preferably from 10 seconds to 300 seconds. The thickness of the resist film formed is preferably from 10 nm to 1,000 nm, and more preferably from 10 nm to 500 nm.

When the immersion exposure is carried out, irrespective of presence of a water repellent polymer additive such as the high fluorine-content resin in the radiation-sensitive resin composition, the formed resist film may have a protective film for the immersion which is not soluble into the immersion liquid on the film in order to prevent a direct contact between the immersion liquid and the resist film. As the protective film for the immersion, a solvent-removable protective film that is removed with a solvent before the developing step (for example, see JP-A-2006-227632); or a developer-removable protective film that is removed during the development of the developing step (for example, see WO2005-069076 and WO2006-035790) may be used. In terms of the throughput, the developer-removable protective film is preferably used.

When the next step, the exposure step, is performed with radiation having a wavelength of 50 nm or less, it is preferable to use a resin having the structural unit (I) and the structural unit (IV) as the base resin in the composition.

[Exposing Step]

In this step (the above mentioned step (2)), the resist film formed in the resist film forming step as the step (1) is exposed by irradiating with a radioactive ray through a photomask (optionally through an immersion medium such as water). Examples of the radioactive ray used for the exposure include visible ray, ultraviolet ray, far ultraviolet ray, extreme ultraviolet ray (EUV); an electromagnetic wave including X ray and γ ray; an electron beam; and a charged particle radiation such as a ray. Among them, far ultraviolet ray, an electron beam, or EUV is preferred. ArF excimer laser light (wavelength is 193 nm), KrF excimer laser light (wavelength is 248 nm), an electron beam, or EUV is more preferred. An electron beam or EUV having a wavelength of 50 nm or less which is identified as the next generation exposing technology is further preferred.

When the exposure is carried out by immersion exposure, examples of the immersion liquid include water and fluorine-based inert liquid. The immersion liquid is preferably a liquid which is transparent with respect to the exposing wavelength, and has a minimum temperature factor of the refractive index so that the distortion of the light image reflected on the film becomes minimum. However, when the exposing light source is ArF excimer laser light (wavelength is 193 nm), water is preferably used because of the ease of availability and ease of handling in addition to the above considerations. When water is used, a small proportion of an additive that decreases the surface tension of water and increases the surface activity may be added. Preferably, the additive cannot dissolve the resist film on the wafer and can neglect an influence on an optical coating at an under surface of a lens. The water used is preferably distilled water.

After the exposure, post exposure bake (PEB) is preferably carried out to promote the dissociation of the acid-dissociable group in the resin by the acid generated from the radiation-sensitive acid generator with the exposure in the exposed part of the resist film. The difference of solubility into the developer between the exposed part and the non-exposed part is generated by the PEB. The temperature of PEB is typically from 50° C. to 180° C., and preferably from 80° C. to 130° C. The duration of PEB is typically from 5 seconds to 600 seconds, and preferably from 10 seconds to 300 seconds.

[Developing Step]

In this step (the above mentioned step (3)), the resist film exposed in the exposing step as the step (2) is developed. By this step, the predetermined resist pattern can be formed. After the development, the resist pattern is washed with a rinse solution such as water or alcohol, and the dried, in general.

Examples of the developer used for the development include, in the alkaline development, an alkaline aqueous solution obtained by dissolving at least one alkaline compound such as sodium hydroxide, potassium hydroxide, sodium carbonate, sodium silicate, sodium metasilicate, ammonia water, ethylamine, n-propylamine, diethylamine, di-n-propylamine, triethylamine, methyldiethylamine, ethyldimethylamine, triethanolamine, tetramethyl ammonium hydroxide (TMAH), pyrrole, piperidine, choline, 1,8-diazabicyclo-[5.4.0]-7-undecene, 1,5-diazabicyclo-[4.3.0]-5-nonene. Among them, an aqueous TMAH solution is preferred, and 2.38% by mass of aqueous TMAH solution is more preferred.

In the case of the development with organic solvent, examples of the solvent include an organic solvent, including a hydrocarbon-based solvent, an ether-based solvent, an ester-based solvent, a ketone-based solvent, and an alcohol-based solvent; and a solvent containing an organic solvent. Examples of the organic solvent include one, two or more solvents listed as the solvent for the radiation-sensitive resin composition. Among them, an ether-based solvent, an ester-based solvent or a ketone-based solvent is preferred. As the ether-based solvent, a glycol ether-based solvent is preferable, and ethylene glycol monomethyl ether and propylene glycol monomethyl ether are more preferable. The ester-based solvent is preferably an acetate ester-based solvent, and more preferably n-butyl acetate or amyl acetate. The ketone-based solvent is preferably a chain ketone, and more preferably 2-heptanone. The content of the organic solvent in the developer is preferably not less than 80% by mass, more preferably not less than 90% by mass, further preferably not less than 95% by mass, and particularly preferably not less than 99% by mass. Examples of the ingredient other than the organic solvent in the developer include water and silicone oil.

As described above, the developer may be either an alkaline developer or an organic solvent developer, but it is preferable that the developer contains an organic solvent and the obtained pattern is a negative pattern.

Examples of the developing method include a method of dipping the substrate in a tank filled with the developer for a given time (dip method); a method of developing by putting and leaving the developer on the surface of the substrate with the surface tension for a given time (paddle method); a method of spraying the developer on the surface of the substrate (spray method); and a method of injecting the developer while scanning an injection nozzle for the developer at a constant rate on the substrate rolling at a constant rate (dynamic dispense method).

EXAMPLES

Hereinafter, the present invention will be specifically described with reference to Examples, but the present invention is not limited to these Examples. Methods for measuring various physical property values are shown below.

[Weight Average Molecular Weight (Mw) and Number Average Molecular Weight (Mn)]

The Mw and Mn of the polymer were measured under the conditions described above. The polydispersity (Mw/Mn) was calculated from the measurement results of Mw and Mn.

[$^{13}$C-NMR Analysis]

$^{13}$C-NMR analysis of the polymer was performed using a nuclear magnetic resonance apparatus ("JNM-Delta 400" manufactured by JEOL Ltd.).

<Synthesis of Resin and High Fluorine-Content Resin>

The monomers used in the synthesis of each resin and high fluorine-content resin in Examples and Comparative Examples are shown below. In the following synthesis examples, unless otherwise specified, parts by mass means a value when the total mass of monomers used is 100 parts by mass, and mol % means a value when the total number of moles of monomers used is 100 mol %.

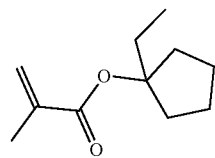

(M-1)

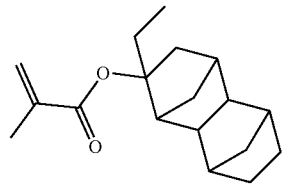

(M-2)

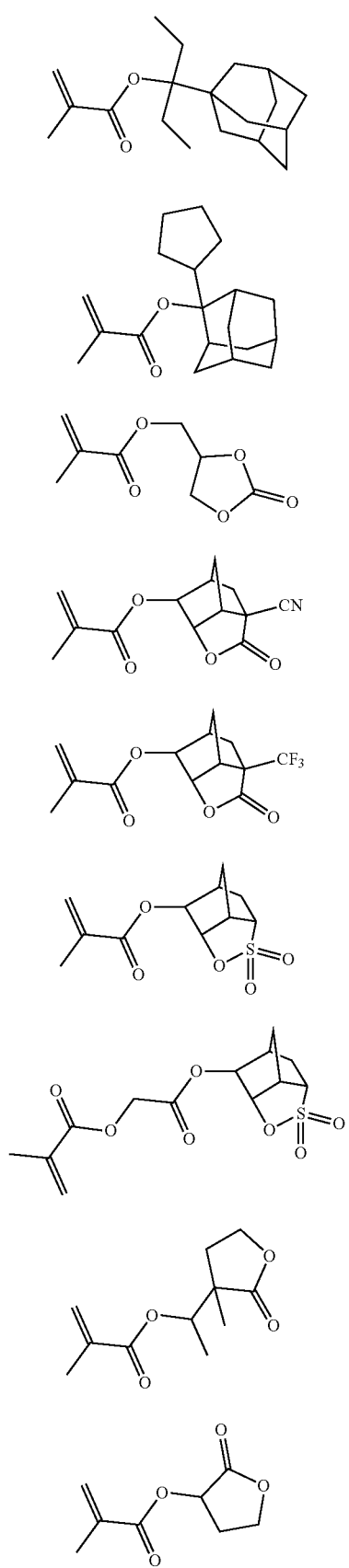
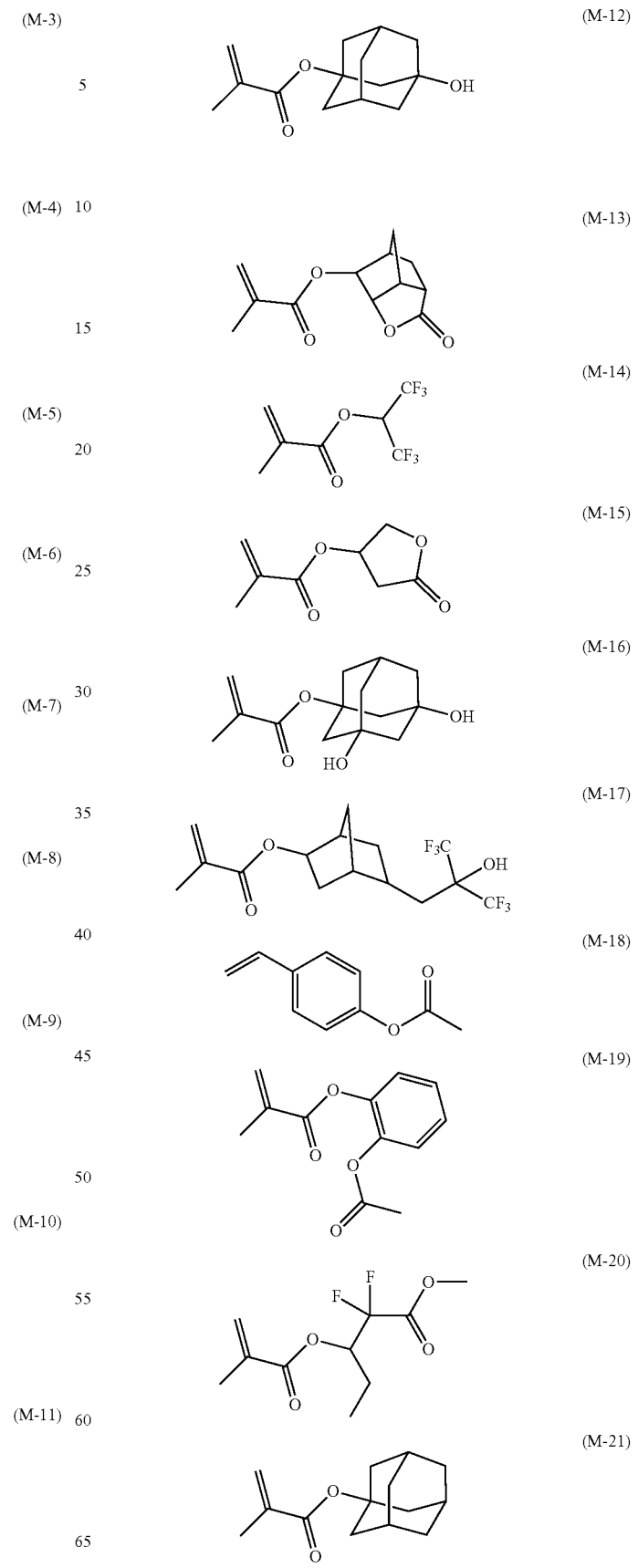

-continued

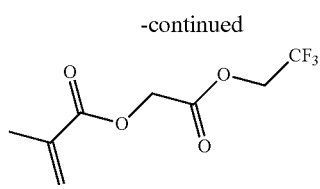
(M-22)

Synthesis Example 1

(Synthesis of Resin (A-1))

The monomer (M-1), the monomer (M-2), and the monomer (M-10) were dissolved in 2-butanone (200 parts by mass) so as to have a molar ratio of 40/15/45 (mol %), and AIBN (azobisisobutyronitrile) (3 mol % with respect to 100 mol % in total of the used monomers) was added as an initiator to prepare a monomer solution. A reaction vessel was charged with 2-butanone (100 parts by mass) and purged with nitrogen for 30 minutes, and inside of the reaction vessel was adjusted to 80° C. Then, the monomer solution was added dropwise thereto over 3 hours with stirring. The polymerization reaction was performed for 6 hours with the start of dropwise addition as the initiation time of the polymerization reaction. After completion of the polymerization reaction, the polymerization solution was cooled to 30° C. or lower by water cooling. The cooled polymerization solution was added to methanol (2,000 parts by mass), and the precipitated white powder was separated by filtration. The separated white powder was washed with methanol twice, then separated by filtration, and dried at 50° C. for 24 hours to obtain a white powdery resin (A-1) (yield: 80%). The resin (A-1) had a Mw of 8,700 and a Mw/Mn of 1.49. As a result of $^{13}$C-NMR analysis, the contents of the structural units derived from (M-1), (M-2), and (M-10) were 39.9 mol %, 14.3 mol %, and 45.8 mol %, respectively.

Synthesis Examples 2 to 11

(Synthesis of Resins (A-2) to (A-11))

Resins (A-2) to (A-11) were synthesized in the same manner as in Synthesis Example 1 except that monomers of types and blending ratios shown in the following Table 1 were used. The content (mol %), yield (%), and physical property values (Mw and Mw/Mn) of each structural unit of the obtained resins are shown together in the following Table 1. Incidentally, "-" in the following Table 1 indicates that the corresponding monomer was not used (the same applies to the following tables.).

TABLE 1

| | | MONOMER PROVIDING STRUCTURAL UNIT (I) | | MONOMER PROVIDING STRUCTURAL UNIT (II) | | MONOMER PROVIDING STRUCTURAL UNIT (III) | | | |
|---|---|---|---|---|---|---|---|---|---|
| RESIN | TYPE | BLENDING RATIO (mol %) | STRUCTURAL UNIT CONTENT (mol %) | TYPE | BLENDING RATIO (mol %) | STRUCTURAL UNIT CONTENT (mol %) | TYPE | BLENDING RATIO (mol %) | STRUCTURAL UNIT CONTENT (mol %) | mw | Mw/Mn |
| SYNTHESIS EXAMPLE 1 | A-1 | M-1 M-2 | 40 15 | 39.9 14.3 | M-10 | 45 | 45.8 | — | — | — | 8700 | 1.49 |
| SYNTHESIS EXAMPLE 2 | A-2 | M-1 M-2 | 30 10 | 31.4 8.0 | M-15 | 60 | 60.6 | — | — | — | 9000 | 1.44 |
| SYNTHESIS EXAMPLE 3 | A-3 | M-1 M-3 | 30 10 | 31.9 6.4 | M-11 | 60 | 61.7 | — | — | — | 8900 | 1.39 |
| SYNTHESIS EXAMPLE 4 | A-4 | M-1 M-3 | 35 20 | 32.3 18.1 | M-13 | 45 | 49.6 | — | — | — | 8500 | 1.59 |
| SYNTHESIS EXAMPLE 5 | A-5 | M-1 M-4 | 40 15 | 41.1 13.2 | M-9 | 45 | 45.7 | — | — | — | 8700 | 1.44 |
| SYNTHESIS EXAMPLE 6 | A-6 | M-1 M-4 | 40 15 | 41.6 12.3 | M-8 | 45 | 46.1 | — | — | — | 7700 | 1.51 |
| SYNTHESIS EXAMPLE 7 | A-7 | M-1 | 40 | 42.4 | M-7 | 45 | 39.5 | M-12 | 15 | 18.1 | 7800 | 1.59 |
| SYNTHESIS EXAMPLE 8 | A-8 | M-1 | 40 | 41.1 | M-6 | 40 | 35.7 | M-16 | 20 | 23.2 | 8100 | 1.56 |
| SYNTHESIS EXAMPLE 9 | A-9 | M-1 | 50 | 51.0 | M-5 | 50 | 49.0 | — | — | — | 7800 | 1.55 |
| SYNTHESIS EXAMPLE 10 | A-10 | M-1 | 40 | 44.4 | M-13 | 60 | 55.6 | — | — | — | 7900 | 1.59 |
| SYNTHESIS EXAMPLE 11 | A-11 | M-1 | 40 | 42.8 | M-6 | 60 | 57.2 | — | — | — | 8000 | 1.43 |

Synthesis Example 12

(Synthesis of Resin (A-12))

The monomer (M-1) and the monomer (M-18) were dissolved in 1-methoxy-2-propanol (200 parts by mass) so as to have a molar ratio of 50/50 (mol %), and AIBN (5 mol %) was added as an initiator to prepare a monomer solution. A reaction vessel was charged with 1-methoxy-2-propanol (100 parts by mass) and purged with nitrogen for 30 minutes, and inside of the reaction vessel was adjusted to 80° C. Then, the monomer solution was added dropwise thereto over 3 hours with stirring. The polymerization reaction was performed for 6 hours with the start of dropwise addition as the initiation time of the polymerization reaction. After completion of the polymerization reaction, the polymerization solution was cooled to 30° C. or lower by water cooling. The cooled polymerization solution was added to hexane (2,000 parts by mass), and the precipitated white powder was separated by filtration. The separated white powder was washed twice with hexane, then separated by filtration, and dissolved in 1-methoxy-2-propanol (300 parts by mass). Subsequently, methanol (500 parts by mass), triethylamine (50 parts by mass), and ultrapure water (10 parts by mass) were added, and a hydrolysis reaction was performed at 70° C. for 6 hours with stirring. After completion of the reaction, the remaining solvent was distilled off, and the obtained solid was dissolved in acetone (100 parts by mass). The solution was added dropwise to water (500 parts by mass) to solidify the resin. The resulting solid was separated by filtration and dried at 50° C. for 13 hours to obtain a white powdery resin (A-12) (yield: 79%). The resin (A-12) had a Mw of 5,200 and a Mw/Mn of 1.60. As a result of $^{13}$C-NMR analysis, the contents of the structural units derived from (M-1) and (M-18) were 51.3 mol % and 48.7 mol %, respectively.

Synthesis Examples 13 to 15

(Synthesis of Resins (A-13) to (A-15))

Resins (A-13) to (A-15) were synthesized in the same manner as in Synthesis Example 12 except that monomers of types and blending ratios shown in the following Table 2 were used. The content (mol %), yield (%), and physical property values (Mw and Mw/Mn) of each structural unit of the obtained resins are also shown in the following Table 2.

TABLE 2

| | RESIN | MONOMER PROVIDING STRUCTURAL UNIT (I) | | | MONOMER PROVIDING STRUCTURAL UNIT (III) | | | MONOMER PROVIDING STRUCTURAL UNIT (IV) | | | Mw | Mw/Mn |
|---|---|---|---|---|---|---|---|---|---|---|---|---|
| | | TYPE | BLENDING RATIO (mol %) | STRUCTURAL UNIT CONTENT (mol %) | TYPE | BLENDING RATIO (mol %) | STRUCTURAL UNIT CONTENT (mol %) | TYPE | BLENDING RATIO (mol %) | STRUCTURAL UNIT CONTENT (mol %) | | |
| SYNTHESIS EXAMPLE 12 | A-12 | M-1 | 50 | 51.3 | — | — | — | M-18 | 50 | 48.7 | 5200 | 1.60 |
| SYNTHESIS EXAMPLE 13 | A-13 | M-3 | 50 | 47.7 | M-16 | 20 | 20.1 | M-19 | 30 | 32.2 | 5800 | 1.51 |
| SYNTHESIS EXAMPLE 14 | A-14 | M-2 | 50 | 48.1 | M-17 | 20 | 21.3 | M-18 | 30 | 30.6 | 5100 | 1.59 |
| SYNTHESIS EXAMPLE 15 | A-15 | M-1 | 55 | 54.3 | M-17 | 15 | 15.6 | M-19 | 30 | 30.1 | 6200 | 1.53 |

Synthesis Example 16

(Synthesis of High Fluorine-Content Resin (E-1))

The monomer (M-1) and the monomer (M-20) were dissolved in 2-butanone (200 parts by mass) so as to have a molar ratio of 20/80 (mol %), and AIBN (4 mol %) was added as an initiator to prepare a monomer solution. A reaction vessel was charged with 2-butanone (100 parts by mass) and purged with nitrogen for 30 minutes, and inside of the reaction vessel was adjusted to 80° C. Then, the monomer solution was added dropwise thereto over 3 hours with stirring. The polymerization reaction was performed for 6 hours with the start of dropwise addition as the initiation time of the polymerization reaction. After completion of the polymerization reaction, the polymerization solution was cooled to 30° C. or lower by water cooling. The operation of replacing the solvent with acetonitrile (400 parts by mass), then adding hexane (100 parts by mass), stirring the mixture, and recovering the acetonitrile layer was repeated three times. The solvent was replaced with propylene glycol monomethyl ether acetate to obtain a solution of a high fluorine-content resin (E-1) (yield: 69%). The high fluorine-content resin (E-1) had a Mw of 6,000 and a Mw/Mn of 1.62. As a result of $^{13}$C-NMR analysis, the contents of the structural units derived from (M-1) and (M-20) were 19.9 mol % and 80.1 mol %, respectively.

Synthesis Examples 17 to 20

(Synthesis of High Fluorine-Content Resins (E-2) to (E-5))

High fluorine-content resins (E-2) to (E-5) were synthesized in the same manner as in Synthesis Example 16 except that monomers of the types and blending ratios shown in the following Table 3 were used. The content (mol %), yield (%), and physical property values (Mw and Mw/Mn) of each structural unit of the obtained high fluorine-content resins are shown in the following Table 3.

TABLE 3

| | HIGH FLUORINE-CONTENT RESIN | MONOMER PROVIDING STRUCTURAL UNIT (V) or (VI) | | MONOMER PROVIDING STRUCTURAL UNIT (I) | | MONOMER PROVIDING STRUCTURAL UNIT (II) | | MONOMER PROVIDING ANOTHER STRUCTURAL UNIT | | Mw | Mw/Mn |
|---|---|---|---|---|---|---|---|---|---|---|---|
| | | TYPE | BLENDING RATIO (mol %) / STRUCTURAL UNIT CONTENT (mol %) | TYPE | BLENDING RATIO (mol %) / STRUCTURAL UNIT CONTENT (mol %) | TYPE | BLENDING RATIO (mol %) / STRUCTURAL UNIT CONTENT (mol %) | TYPE | BLENDING RATIO (mol %) / STRUCTURAL UNIT CONTENT (mol %) | | |
| SYNTHESIS EXAMPLE 16 | E-1 | M-20 | 80 / 80.1 | M-1 | 20 / 19.9 | — | — / — | — | — / — | 6000 | 1.62 |
| SYNTHESIS EXAMPLE 17 | E-2 | M-22 | 80 / 81.9 | M-1 | 20 / 18.1 | — | — / — | — | — / — | 7200 | 1.77 |
| SYNTHESIS EXAMPLE 18 | E-3 | M-14 | 60 / 62.3 | — | — / — | — | — / — | M-21 | 40 / 38.7 | 6300 | 1.82 |
| SYNTHESIS EXAMPLE 19 | E-4 | M-14 | 70 / 68.7 | — | — / — | M-12 | 30 / 31.3 | — | — / — | 6500 | 1.81 |
| SYNTHESIS EXAMPLE 20 | E-5 | M-14 | 70 / 72.3 | — | — / — | M-17 | 30 / 27.7 | — | — / — | 6200 | 1.78 |

<Synthesis of Acid Diffusion Controlling Agent C>

Synthesis Example 21

(Synthesis of Compound (C-1))

A compound (C-1) was synthesized according to synthesis scheme below.

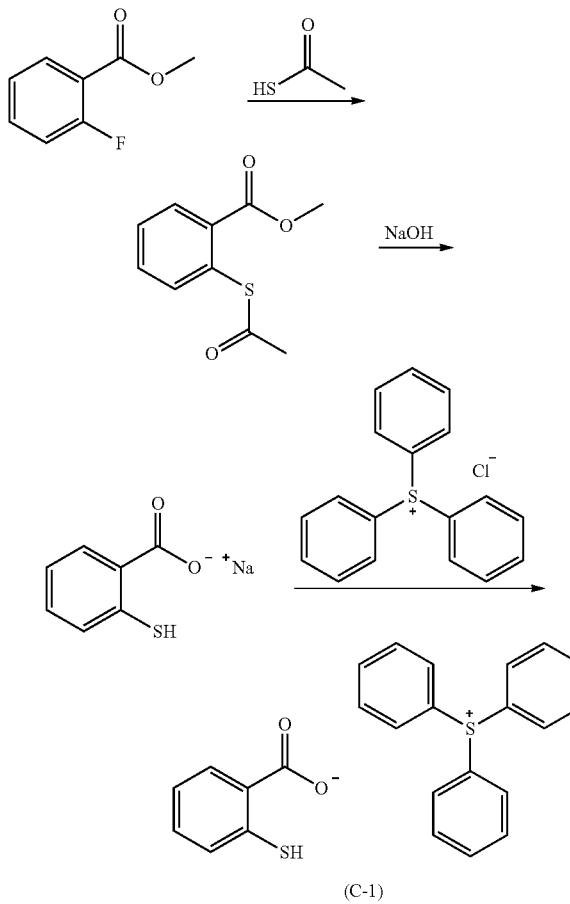

(C-1)

20.0 mmol of methyl 2-fluorobenzoate, 30.0 mmol of thioacetic acid, 40.0 mmol of potassium carbonate, and 50 g of acetone were added to a reaction container, and the mixture was stirred at room temperature for 12 hours. Thereafter, the reaction solution was diluted by adding a saturated aqueous solution of ammonium chloride, and then extracted by adding ethyl acetate to separate an organic layer. The resulting organic layer was washed with a saturated aqueous solution of sodium chloride and then with water. After drying over sodium sulfate, the solvent was distilled off, and purification was performed by column chromatography to obtain an acyl sulfide body in good yield.

A mixed solution of methanol and water (1:1 (mass ratio)) was added to the acyl sulfide body to form a 1 M solution, then 40.0 mmol of sodium hydroxide was added thereto, and the mixture was reacted at 80° C. for 4 hours. The reaction solution was extracted with acetonitrile, and the solvent was distilled off to obtain a sodium salt derivative. 20.0 mmol of triphenylsulfonium chloride was added to the sodium salt derivative, and a mixed solution of water and dichloromethane (1:3 (mass ratio)) was added thereto. The mixture was vigorously stirred at room temperature for 3 hours, and then extracted by adding dichloromethane, to separate an organic layer. The obtained organic layer was dried over sodium sulfate and the solvent was distilled off to obtain a compound (C-1) represented by the formula (C-1) in a good yield.

Synthesis Examples 22 to 42

(Synthesis of Compounds (C-2) to (C-23))

Acid diffusion controlling agents represented by formulas (C-2) to (C-23) below were synthesized in the same manner as in Synthesis Example 21 except that the raw materials and the precursor were appropriately changed.

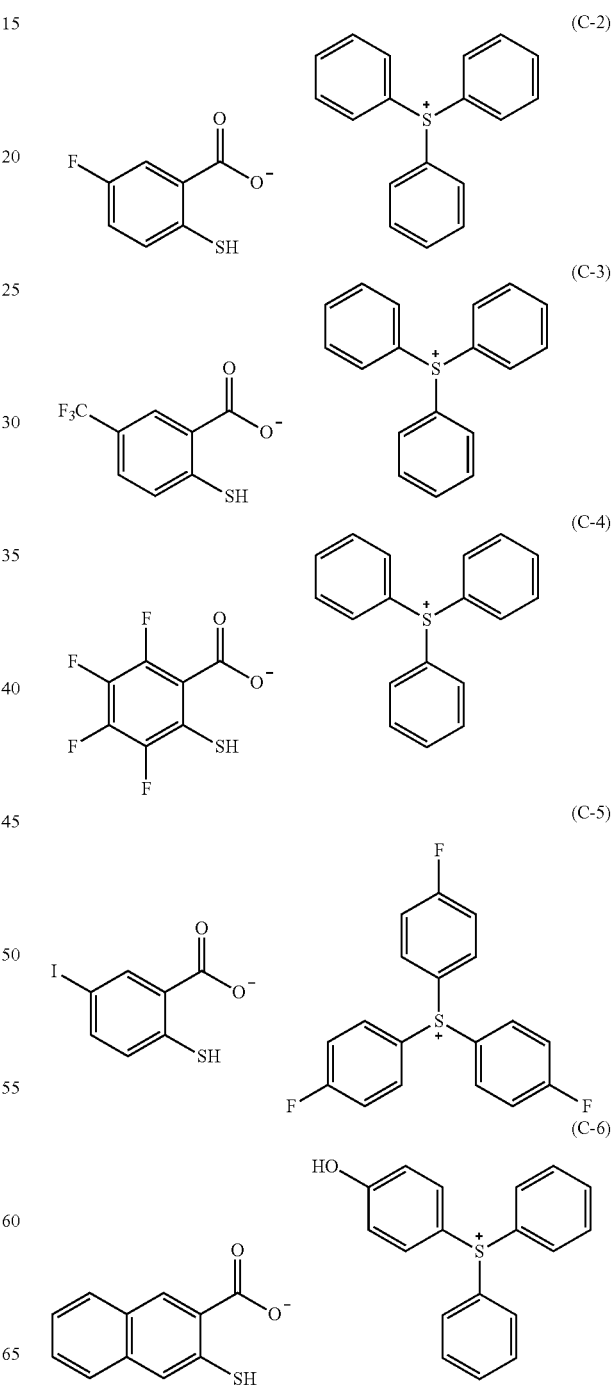

(C-7)
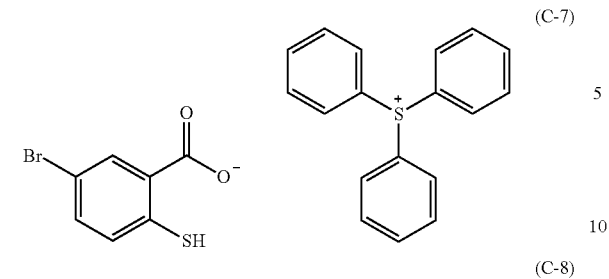
(C-8)
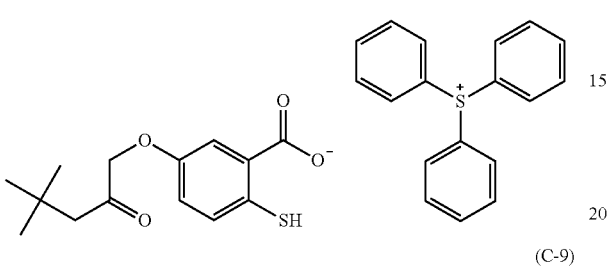
(C-9)
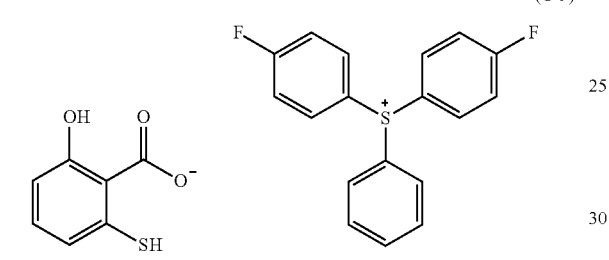
(C-10)
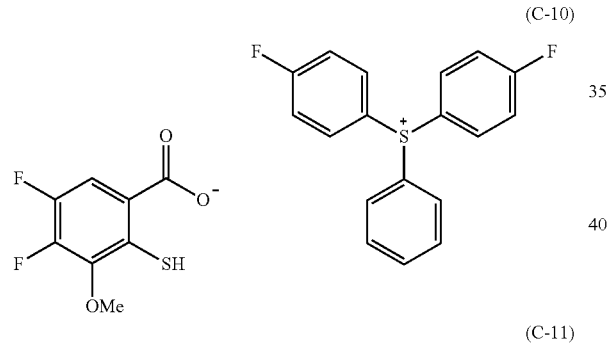
(C-11)
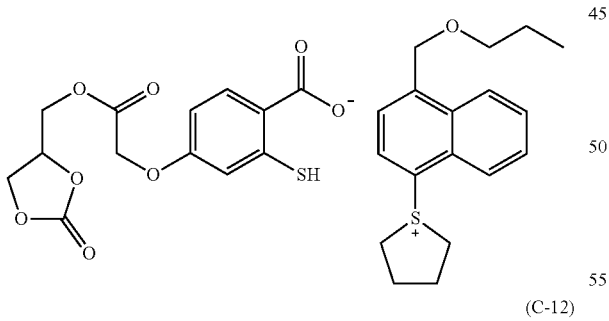
(C-12)
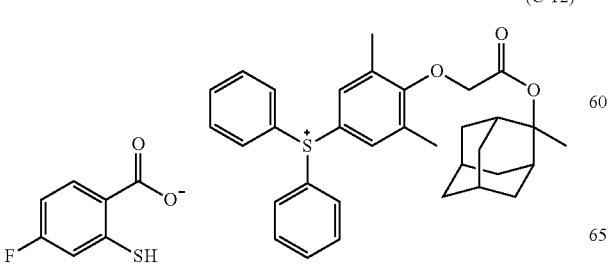
(C-13)
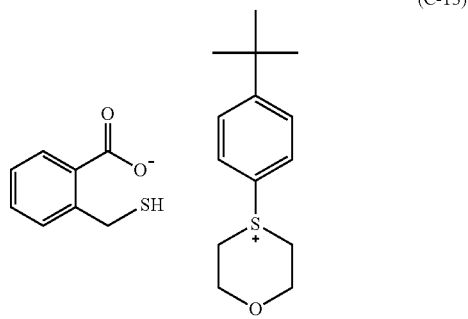
(C-14)
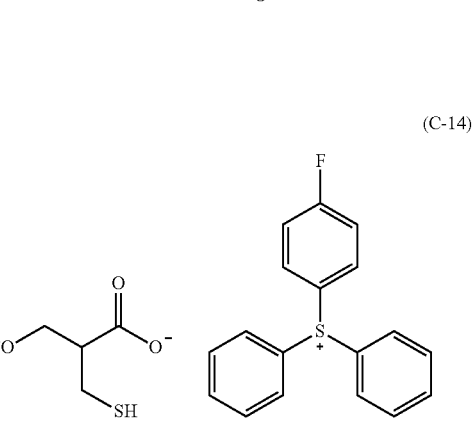
(C-15)
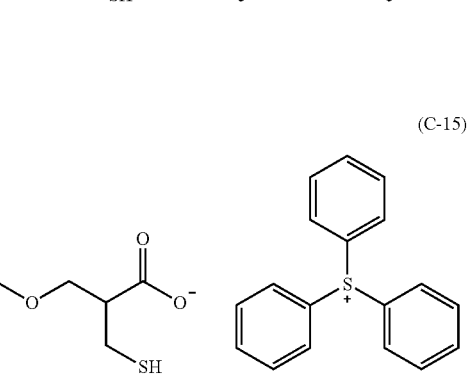
(C-16)
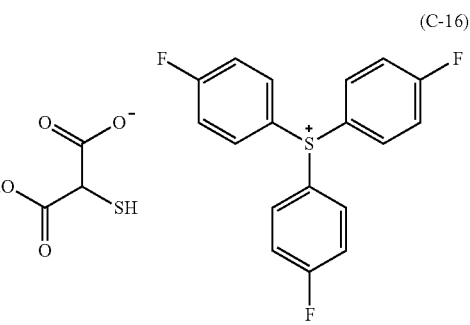
(C-17)
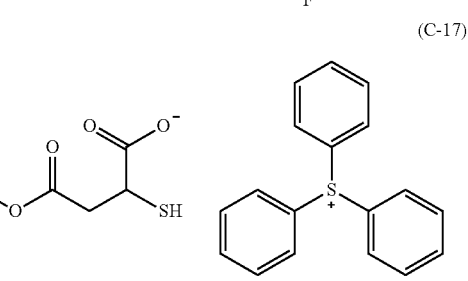

-continued (C-18)

(C-19)

(C-20)

(C-21)

(C-22)

(C-23)

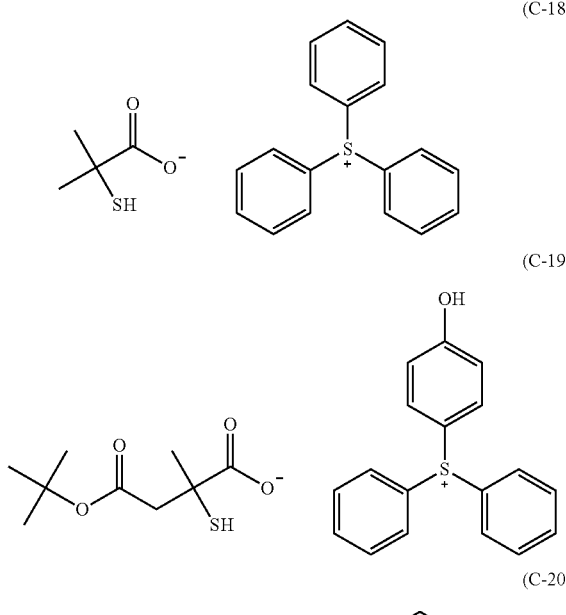

-continued

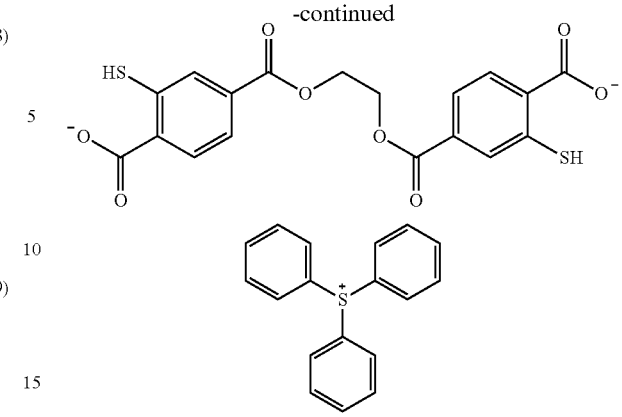

<Preparation of Radiation-Sensitive Resin Composition>

Components other than the resin A, the high fluorine-content resin E, and the acid diffusion controlling agent C used for preparing each radiation-sensitive resin composition are shown below.

[Radiation-Sensitive Acid Generator]

B-1 to B-6: Compounds represented by the following formulas (B-1) to (B-6) (hereinafter, the compounds represented by the formulas (B-1) to (B-6) may be described as "radiation-sensitive acid generators (B-1) to (B-6)", respectively.)

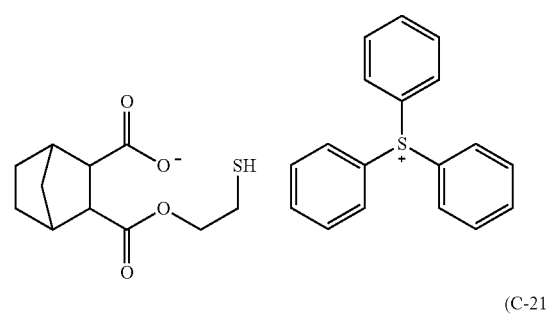

(B-1)

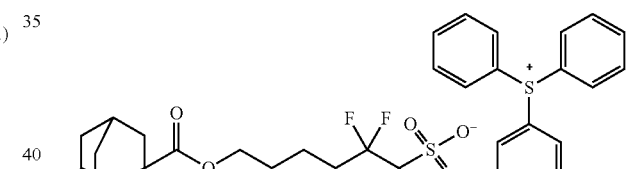

(B-2)

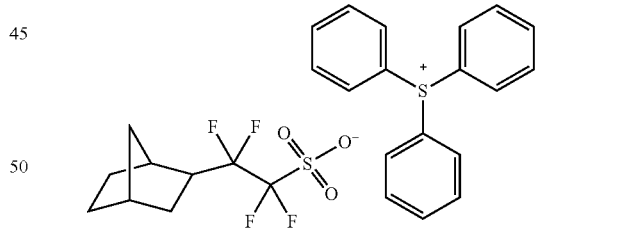

(B-3)

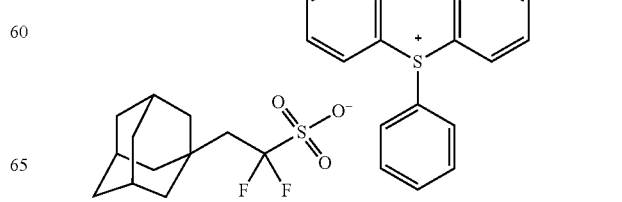

-continued
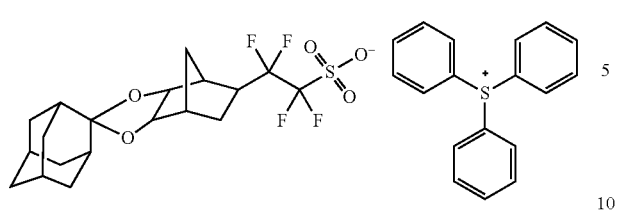
(B-4)
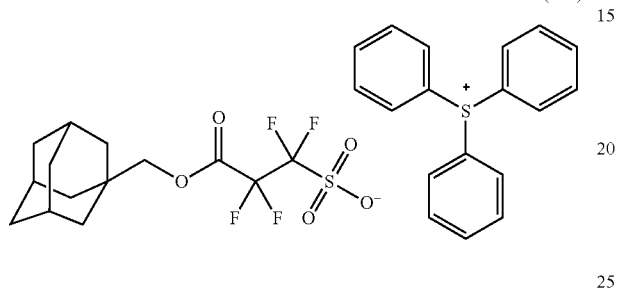
(B-5)
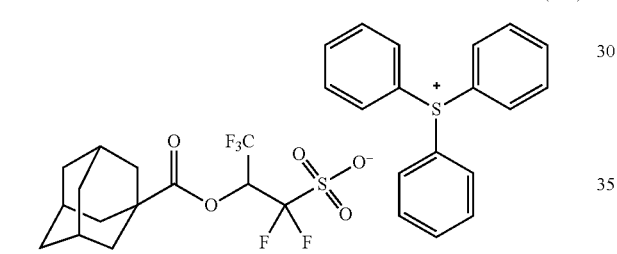
(B-6)
[Acid Diffusion Controlling Agent Other than Compounds (C-1) to (C-23)]
cc-1 to cc-11: Compounds represented by the following formulas (cc-1) to (cc-11) (hereinafter, the compounds represented by the formulas (cc-1) to (cc-11) may be described as "compounds (cc-1) to (cc-11)", respectively.)
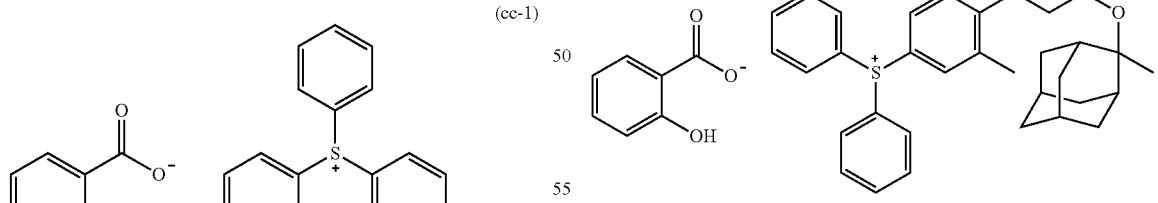
-continued
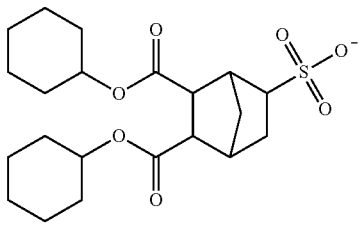
(cc-3)
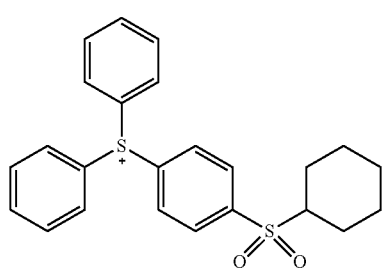
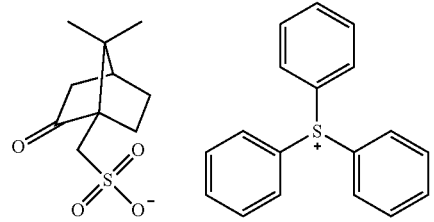
(cc-4)
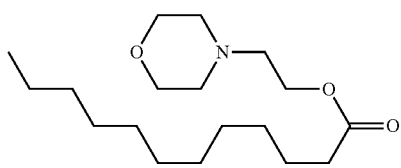
(cc-5)
(cc-6)
(cc-1)
(cc-2)
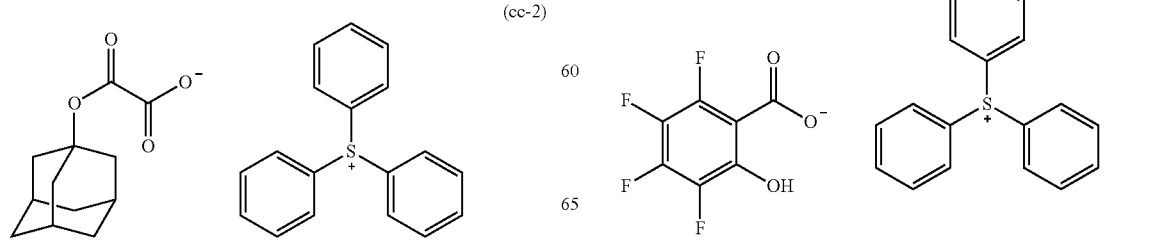
(cc-7)

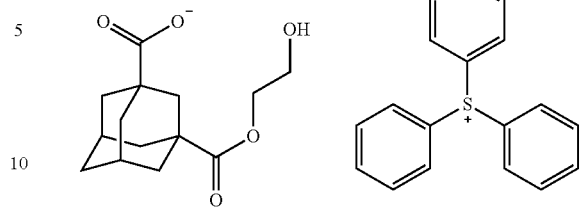

(cc-8)

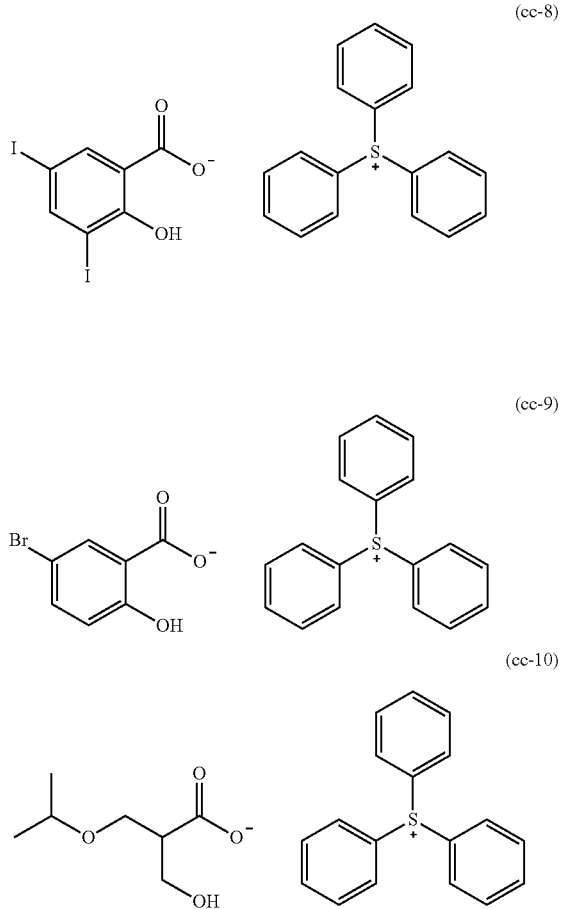

(cc-11)

[[D] Solvent]
D-1: Propylene glycol monomethyl ether acetate
D-2: Propylene glycol monomethyl ether
D-3: γ-Butyrolactone
D-4: Ethyl lactate

[Preparation of Positive Radiation-Sensitive Resin Composition for ArF Exposure]

Example 1

First, 100 parts by mass of (A-1) as a resin, 12.0 parts by mass of (B-1) as a radiation-sensitive acid generator, 3.0 parts by mass of (C-1) as an acid diffusion controlling agent, 3.0 parts by mass (solid content) of (E-1) as a high fluorine-content resin, and 3,230 parts by mass of a mixed solvent of (D-1)/(D-2)/(D-3)=70/29/1 (mass ratio) as a solvent were mixed, and the mixture was filtered through a membrane filter having a pore diameter of 0.2 μm to prepare a radiation-sensitive resin composition (J-1).

Examples 2 to 51 and Comparative Examples 1 to 11

Radiation-sensitive resin compositions (J-2) to (J-51) and (CJ-1) to (CJ-11) were prepared in the same manner as in Example 1 except that the components of the types and contents shown in the following Table 4 were used.

TABLE 4

| Radiation-sensitive resin composition | [A] Resin Type | Content (parts by mass) | [B] Radiation-sensitive acid generator Type | Content (parts by mass) | [C] Acid diffusion controlling agent Type | Content (parts by mass) | [E] High fluorine-content resin Type | Content (parts by mass) | [D] Solvent Type | Content (parts by mass) |
|---|---|---|---|---|---|---|---|---|---|---|
| Example 1 | J-1 | A-1 | 100 | B-1 | 12.0 | C-1 | 3.0 | E-1 | 3.0 | D-1/D-2/D-3 | 2240/960/30 |
| Example 2 | J-2 | A-1 | 100 | B-1 | 12.0 | C-2 | 3.0 | E-1 | 3.0 | D-1/D-2/D-3 | 2240/960/30 |
| Example 3 | J-3 | A-1 | 100 | B-1 | 12.0 | C-3 | 3.0 | E-1 | 3.0 | D-1/D-2/D-3 | 2240/960/30 |
| Example 4 | J-4 | A-1 | 100 | B-1 | 12.0 | C-4 | 3.0 | E-1 | 3.0 | D-1/D-2/D-3 | 2240/960/30 |
| Example 5 | J-5 | A-1 | 100 | B-1 | 12.0 | C-5 | 3.0 | E-1 | 3.0 | D-1/D-2/D-3 | 2240/960/30 |
| Example 6 | J-6 | A-1 | 100 | B-1 | 12.0 | C-6 | 3.0 | E-1 | 3.0 | D-1/D-2/D-3 | 2240/960/30 |
| Example 7 | J-7 | A-1 | 100 | B-1 | 12.0 | C-7 | 3.0 | E-1 | 3.0 | D-1/D-2/D-3 | 2240/960/30 |
| Example 8 | J-8 | A-1 | 100 | B-1 | 12.0 | C-8 | 3.0 | E-1 | 3.0 | D-1/D-2/D-3 | 2240/960/30 |
| Example 9 | J-9 | A-1 | 100 | B-1 | 12.0 | C-9 | 3.0 | E-1 | 3.0 | D-1/D-2/D-3 | 2240/960/30 |
| Example 10 | J-10 | A-1 | 100 | B-1 | 12.0 | C-10 | 3.0 | E-1 | 3.0 | D-1/D-2/D-3 | 2240/960/30 |
| Example 11 | J-11 | A-1 | 100 | B-1 | 12.0 | C-11 | 3.0 | E-1 | 3.0 | D-1/D-2/D-3 | 2240/960/30 |
| Example 12 | J-12 | A-1 | 100 | B-1 | 12.0 | C-12 | 3.0 | E-1 | 3.0 | D-1/D-2/D-3 | 2240/960/30 |

TABLE 4-continued

| | Radiation-sensitive resin composition | [A] Resin | | [B] Radiation-sensitive acid generator | | [C] Acid diffusion controlling agent | | [E] High fluorine-content resin | | [D] Solvent | |
|---|---|---|---|---|---|---|---|---|---|---|---|
| | | Type | Content (parts by mass) | Type | Content (parts by mass) | Type | Content (parts by mass) | Type | Content (parts by mass) | Type | Content (parts by mass) |
| Example 13 | J-13 | A-1 | 100 | B-1 | 12.0 | C-13 | 3.0 | E-1 | 3.0 | D-1/D-2/D-3 | 2240/960/30 |
| Example 14 | J-14 | A-1 | 100 | B-1 | 12.0 | C-14 | 3.0 | E-1 | 3.0 | D-1/D-2/D-3 | 2240/960/30 |
| Example 15 | J-15 | A-1 | 100 | B-1 | 12.0 | C-15 | 3.0 | E-1 | 3.0 | D-1/D-2/D-3 | 2240/960/30 |
| Example 16 | J-16 | A-1 | 100 | B-1 | 12.0 | C-16 | 3.0 | E-1 | 3.0 | D-1/D-2/D-3 | 2240/960/30 |
| Example 17 | J-17 | A-1 | 100 | B-1 | 12.0 | C-17 | 3.0 | E-1 | 3.0 | D-1/D-2/D-3 | 2240/960/30 |
| Example 18 | J-18 | A-1 | 100 | B-1 | 12.0 | C-18 | 3.0 | E-1 | 3.0 | D-1/D-2/D-3 | 2240/960/30 |
| Example 19 | J-19 | A-1 | 100 | B-1 | 12.0 | C-19 | 3.0 | E-1 | 3.0 | D-1/D-2/D-3 | 2240/960/30 |
| Example 20 | J-20 | A-1 | 100 | B-1 | 12.0 | C-20 | 3.0 | E-1 | 3.0 | D-1/D-2/D-3 | 2240/960/30 |
| Example 21 | J-21 | A-1 | 100 | B-1 | 12.0 | C-21 | 3.0 | E-1 | 3.0 | D-1/D-2/D-3 | 2240/960/30 |
| Example 22 | J-22 | A-1 | 100 | B-1 | 12.0 | C-22 | 3.0 | E-1 | 3.0 | D-1/D-2/D-3 | 2240/960/30 |
| Example 23 | J-23 | A-1 | 100 | B-1 | 12.0 | C-23 | 3.0 | E-1 | 3.0 | D-1/D-2/D-3 | 2240/960/30 |
| Example 24 | J-24 | A-2 | 100 | B-1 | 12.0 | C-1 | 3.0 | E-1 | 3.0 | D-1/D-2/D-3 | 2240/960/30 |
| Example 25 | J-25 | A-3 | 100 | B-1 | 12.0 | C-1 | 3.0 | E-1 | 3.0 | D-1/D-2/D-3 | 2240/960/30 |
| Example 26 | J-26 | A-4 | 100 | B-1 | 12.0 | C-1 | 3.0 | E-1 | 3.0 | D-1/D-2/D-3 | 2240/960/30 |
| Example 27 | J-27 | A-5 | 100 | B-1 | 12.0 | C-1 | 3.0 | E-1 | 3.0 | D-1/D-2/D-3 | 2240/960/30 |
| Example 28 | J-28 | A-6 | 100 | B-1 | 12.0 | C-1 | 3.0 | E-1 | 3.0 | D-1/D-2/D-3 | 2240/960/30 |
| Example 29 | J-29 | A-7 | 100 | B-1 | 12.0 | C-1 | 3.0 | E-1 | 3.0 | D-1/D-2/D-3 | 2240/960/30 |
| Example 30 | J-30 | A-8 | 100 | B-1 | 12.0 | C-1 | 3.0 | E-1 | 3.0 | D-1/D-2/D-3 | 2240/960/30 |
| Example 31 | J-31 | A-9 | 100 | B-1 | 12.0 | C-1 | 3.0 | E-1 | 3.0 | D-1/D-2/D-3 | 2240/960/30 |
| Example 32 | J-32 | A-10 | 100 | B-1 | 12.0 | C-1 | 3.0 | E-1 | 3.0 | D-1/D-2/D-3 | 2240/960/30 |
| Example 33 | J-33 | A-11 | 100 | B-1 | 12.0 | C-1 | 3.0 | E-1 | 3.0 | D-1/D-2/D-3 | 2240/960/30 |
| Example 34 | J-34 | A-1 | 100 | B-2 | 12.0 | C-1 | 3.0 | E-1 | 3.0 | D-1/D-2/D-3 | 2240/960/30 |
| Example 35 | J-35 | A-1 | 100 | B-3 | 12.0 | C-1 | 3.0 | E-1 | 3.0 | D-1/D-2/D-3 | 2240/960/30 |
| Example 36 | J-36 | A-1 | 100 | B-4 | 12.0 | C-1 | 3.0 | E-1 | 3.0 | D-1/D-2/D-3 | 2240/960/30 |
| Example 37 | J-37 | A-1 | 100 | B-5 | 12.0 | C-1 | 3.0 | E-1 | 3.0 | D-1/D-2/D-3 | 2240/960/30 |
| Example 38 | J-38 | A-1 | 100 | B-6 | 12.0 | C-1 | 3.0 | E-1 | 3.0 | D-1/D-2/D-3 | 2240/960/30 |
| Example 39 | J-39 | A-1 | 100 | B-1 | 12.0 | C-1 | 3.0 | E-2 | 3.0 | D-1/D-2/D-3 | 2240/960/30 |
| Example 40 | J-40 | A-1 | 100 | B-1 | 12.0 | C-1 | 3.0 | E-3 | 3.0 | D-1/D-2/D-3 | 2240/960/30 |
| Example 41 | J-41 | A-1 | 100 | B-1 | 12.0 | C-1 | 3.0 | E-4 | 3.0 | D-1/D-2/D-3 | 2240/960/30 |
| Example 42 | J-42 | A-1 | 100 | B-1 | 12.0 | C-1 | 0.3 | E-1 | 3.0 | D-1/D-2/D-3 | 2240/960/30 |
| Example 43 | J-43 | A-1 | 100 | B-1 | 12.0 | C-1 | 6.0 | E-1 | 3.0 | D-1/D-2/D-3 | 2240/960/30 |
| Example 44 | J-44 | A-1 | 100 | B-1 | 12.0 | C-1 | 12.0 | E-1 | 3.0 | D-1/D-2/D-3 | 2240/960/30 |
| Example 45 | J-45 | A-1 | 100 | B-1 | 12.0 | C-1/cc-3 | 1.5/1.5 | E-1 | 3.0 | D-1/D-2/D-3 | 2240/960/30 |
| Example 46 | J-46 | A-1 | 100 | B-1 | 12.0 | C-1/cc-4 | 1.5/1.5 | E-1 | 3.0 | D-1/D-2/D-3 | 2240/960/30 |
| Example 47 | J-47 | A-1 | 100 | B-1 | 12.0 | C-1/cc-6 | 1.5/1.5 | E-1 | 3.0 | D-1/D-2/D-3 | 2240/960/30 |
| Example 48 | J-48 | A-1 | 100 | B-1 | 12.0 | C-1/cc-8 | 1.5/1.5 | E-1 | 3.0 | D-1/D-2/D-3 | 2240/960/30 |
| Example 49 | J-49 | A-1 | 100 | B-1/B-3 | 6.0/6.0 | C-1 | 3.0 | E-1 | 3.0 | D-1/D-2/D-3 | 2240/960/30 |
| Example 50 | J-50 | A-1 | 100 | B-1/B-5 | 6.0/6.0 | C-1 | 3.0 | E-1 | 3.0 | D-1/D-2/D-3 | 2240/960/30 |
| Example 51 | J-51 | A-1 | 100 | B-1/B-6 | 6.0/6.0 | C-1 | 3.0 | E-1 | 3.0 | D-1/D-2/D-3 | 2240/960/30 |
| Comparative Example 1 | CJ-1 | A-1 | 100 | B-1 | 12.0 | cc-1 | 3.0 | E-1 | 3.0 | D-1/D-2/D-3 | 2240/960/30 |
| Comparative Example 2 | CJ-2 | A-1 | 100 | B-1 | 12.0 | cc-2 | 3.0 | E-1 | 3.0 | D-1/D-2/D-3 | 2240/960/30 |
| Comparative Example 3 | CJ-3 | A-1 | 100 | B-1 | 12.0 | cc-3 | 3.0 | E-1 | 3.0 | D-1/D-2/D-3 | 2240/960/30 |
| Comparative Example 4 | CJ-4 | A-1 | 100 | B-1 | 12.0 | cc-4 | 3.0 | E-1 | 3.0 | D-1/D-2/D-3 | 2240/960/30 |
| Comparative Example 5 | CJ-5 | A-1 | 100 | B-1 | 12.0 | cc-5 | 3.0 | E-1 | 3.0 | D-1/D-2/D-3 | 2240/960/30 |
| Comparative Example 6 | CJ-6 | A-1 | 100 | B-1 | 12.0 | cc-6 | 3.0 | E-1 | 3.0 | D-1/D-2/D-3 | 2240/960/30 |
| Comparative Example 7 | CJ-7 | A-1 | 100 | B-1 | 12.0 | cc-7 | 3.0 | E-1 | 3.0 | D-1/D-2/D-3 | 2240/960/30 |
| Comparative Example 8 | CJ-8 | A-1 | 100 | B-1 | 12.0 | cc-8 | 3.0 | E-1 | 3.0 | D-1/D-2/D-3 | 2240/960/30 |
| Comparative Example 9 | CJ-9 | A-1 | 100 | B-1 | 12.0 | cc-9 | 3.0 | E-1 | 3.0 | D-1/D-2/D-3 | 2240/960/30 |
| Comparative Example 10 | CJ-10 | A-1 | 100 | B-1 | 12.0 | cc-10 | 3.0 | E-1 | 3.0 | D-1/D-2/D-3 | 2240/960/30 |
| Comparative Example 11 | CJ-11 | A-1 | 100 | B-1 | 12.0 | cc-11 | 3.0 | E-1 | 3.0 | D-1/D-2/D-3 | 2240/960/30 |

<Formation of Resist Pattern Using Positive Radiation-Sensitive Resin Composition for ArF Exposure>

A composition for forming an underlayer antireflective film ("ARC66" manufactured by Brewer Science, Inc.) was applied onto a 12 inch silicon wafer using a spin coater ("CLEAN TRACK ACT12" manufactured by Tokyo Electron Limited), and then heated at 205° C. for 60 seconds to form an underlayer antireflective film having an average thickness of 105 nm. The positive radiation-sensitive resin composition for ArF exposure prepared above was applied onto the underlayer antireflective film using the spin coater, and subjected to PB (prebake) at 90° C. for 60 seconds. Thereafter, cooling was performed at 23° C. for 30 seconds to form a resist film having an average thickness of 90 nm. Subsequently, this resist film was exposed through a mask pattern of 40 nm space and 105 nm pitch using an ArF excimer laser immersion exposure apparatus ("TWINSCAN XT-1900i" manufactured by ASML Holding N.V.) under optical conditions of a numeral aperture (NA) of 1.35 and annular illumination ($\sigma=0.8/0.6$). After the exposure, PEB (post exposure bake) was performed at 90° C. for 60 seconds. Thereafter, the resist film was subjected to alkaline development using a 2.38 mass % aqueous TMAH solution as an alkaline developer. After the development, the resist film was washed with water and further dried to form a positive resist pattern (40 nm line-and-space pattern). In addition, a positive resist pattern (40 nm hole, 105 nm pitch) was formed in the same manner as in the above operation except that the mask pattern was changed.

<Evaluation>

The sensitivity, LWR performance, and CDU performance of each of resist patterns formed using the positive radiation-sensitive resin compositions for ArF exposure were evaluated according to the following methods. The results are shown in the following Table 5. It is to be noted that a scanning electron microscope ("CG-5000" manufactured by Hitachi High-Tech Corporation) was used for measurement of the resist pattern.

[Sensitivity]

An exposure dose at which a 40 nm line-and-space pattern was formed in formation of a resist pattern using the positive radiation-sensitive resin composition for ArF exposure was defined as an optimum exposure dose, and this optimum exposure dose was defined as sensitivity (mJ/cm$^2$). A case where the sensitivity was 27 mJ/cm$^2$ or less was evaluated as "good", and a case where the sensitivity exceeded 27 mJ/cm$^2$ was evaluated as "poor".

[CDU Performance]

A resist pattern with 40 nm holes and 105 nm pitches was measured using the scanning electron microscope, and measurement was performed at any 1,800 points in total from above the pattern. The dimensional variation (3$\sigma$) was determined and taken as the CDU performance (nm). A smaller value of CDU indicates smaller variation in the hole diameter in the long period and better performance. A case where the CDU performance was 4.0 nm or less was evaluated as "good", and a case where the CDU performance exceeded 4.0 nm was evaluated as "poor".

[LWR Performance]

A resist pattern was formed with the mask size adjusted so as to form a 40 nm line-and-space pattern by irradiation with the optimum exposure dose obtained in the evaluation of the sensitivity. The formed resist pattern was observed from above the pattern using the scanning electron microscope. The variation in line width was measured at 500 points in total, the value of 3$\sigma$ was obtained from the distribution of the measured values, and the value of 3$\sigma$ was defined as LWR (nm). A smaller value of LWR indicates smaller roughness of the line and better performance. A case where the LWR performance was 3.0 nm or less was evaluated as "good", and a case where the LWR performance exceeded 3.0 nm was evaluated as "poor".

TABLE 5

| | Radiation-sensitive resin composition | Sensitivity (mJ/cm$^2$) | CDU (nm) | LWR (nm) |
|---|---|---|---|---|
| Example 1 | J-1 | 22 | 3.5 | 2.1 |
| Example 2 | J-2 | 22 | 3.4 | 2.4 |
| Example 3 | J-3 | 21 | 3.3 | 2.1 |
| Example 4 | J-4 | 19 | 3.0 | 2.5 |
| Example 5 | J-5 | 22 | 3.2 | 2.2 |
| Example 6 | J-6 | 23 | 3.6 | 2.4 |
| Example 7 | J-7 | 21 | 3.3 | 2.3 |
| Example 8 | J-8 | 21 | 3.1 | 2.0 |
| Example 9 | J-9 | 20 | 3.2 | 2.3 |
| Example 10 | J-10 | 22 | 3.4 | 2.1 |
| Example 11 | J-11 | 20 | 3.3 | 2.1 |
| Example 12 | J-12 | 19 | 3.0 | 2.0 |
| Example 13 | J-13 | 23 | 3.5 | 2.4 |
| Example 14 | J-14 | 23 | 3.2 | 2.2 |
| Example 15 | J-15 | 22 | 3.1 | 2.3 |
| Example 16 | J-16 | 23 | 3.6 | 2.6 |
| Example 17 | J-17 | 22 | 3.4 | 2.4 |
| Example 18 | J-18 | 24 | 3.5 | 2.3 |
| Example 19 | J-19 | 24 | 3.4 | 2.3 |
| Example 20 | J-20 | 23 | 3.6 | 2.6 |
| Example 21 | J-21 | 25 | 3.8 | 2.8 |
| Example 22 | J-22 | 22 | 3.2 | 2.7 |
| Example 23 | J-23 | 24 | 3.8 | 2.2 |
| Example 24 | J-24 | 21 | 3.4 | 2.0 |
| Example 25 | J-25 | 22 | 3.4 | 2.3 |
| Example 26 | J-26 | 23 | 3.5 | 2.2 |
| Example 27 | J-27 | 22 | 3.3 | 2.1 |
| Example 28 | J-28 | 23 | 3.2 | 2.1 |
| Example 29 | J-29 | 21 | 3.4 | 2.4 |
| Example 30 | J-30 | 23 | 3.5 | 2.2 |
| Example 31 | J-31 | 24 | 3.6 | 2.0 |
| Example 32 | J-32 | 22 | 3.2 | 2.3 |
| Example 33 | J-33 | 20 | 3.7 | 2.1 |
| Example 34 | J-34 | 20 | 3.6 | 2.4 |
| Example 35 | J-35 | 25 | 3.5 | 2.5 |
| Example 36 | J-36 | 24 | 3.1 | 1.9 |
| Example 37 | J-37 | 18 | 3.6 | 2.0 |
| Example 38 | J-38 | 21 | 3.3 | 2.2 |
| Example 39 | J-39 | 22 | 3.5 | 2.2 |
| Example 40 | J-40 | 23 | 3.5 | 2.1 |
| Example 41 | J-41 | 22 | 3.6 | 2.1 |
| Example 42 | J-42 | 17 | 3.8 | 2.6 |
| Example 43 | J-43 | 24 | 3.6 | 2.4 |
| Example 44 | J-44 | 26 | 3.7 | 2.8 |
| Example 45 | J-45 | 24 | 3.7 | 2.5 |
| Example 46 | J-46 | 25 | 3.8 | 2.4 |
| Example 47 | J-47 | 26 | 3.6 | 2.1 |
| Example 48 | J-48 | 25 | 3.5 | 2.5 |
| Example 49 | J-49 | 23 | 3.4 | 2.0 |
| Example 50 | J-50 | 19 | 3.3 | 1.8 |
| Example 51 | J-51 | 22 | 3.6 | 2.3 |
| Comparative Example 1 | CJ-1 | 32 | 4.7 | 3.3 |
| Comparative Example 2 | CJ-2 | 33 | 4.5 | 3.4 |
| Comparative Example 3 | CJ-3 | 29 | 4.4 | 3.8 |
| Comparative Example 4 | CJ-4 | 29 | 4.8 | 3.7 |
| Comparative Example 5 | CJ-5 | 31 | 5.0 | 4.2 |
| Comparative Example 6 | CJ-6 | 32 | 4.3 | 3.8 |
| Comparative Example 7 | CJ-7 | 29 | 4.5 | 3.3 |
| Comparative Example 8 | CJ-8 | 30 | 4.5 | 3.2 |
| Comparative Example 9 | CJ-9 | 30 | 4.2 | 3.6 |

TABLE 5-continued

| | Radiation-sensitive resin composition | Sensitivity (mJ/cm$^2$) | CDU (nm) | LWR (nm) |
|---|---|---|---|---|
| Comparative Example 10 | CJ-10 | 35 | 4.8 | 3.5 |
| Comparative Example 11 | CJ-11 | 36 | 5.1 | 3.7 |

As is apparent from the results in Table 5, the radiation-sensitive resin compositions of Examples were superior in sensitivity, LWR performance, and CDU performance when used for ArF exposure, whereas the radiation-sensitive resin compositions of Comparative Examples were inferior in each characteristic to Examples. Therefore, when the radiation-sensitive resin compositions of Examples were used for ArF exposure, a resist pattern having high sensitivity and superior LWR performance and CDU performance can be formed.

[Preparation of Positive Radiation-Sensitive Resin Composition for Extreme Ultraviolet (EUV) Exposure]

Example 52

First, 100 parts by mass of (A-12) as a resin, 15.0 parts by mass of (B-5) as a radiation-sensitive acid generator, 4.0 parts by mass of (C-1) as an acid diffusion controlling agent, 3.0 parts by mass of (E-5) as a high fluorine-content resin, and 6,110 parts by mass of a mixed solvent of (D-1)/(D-4) =70/30 (mass ratio) as a solvent were mixed, and the mixture was filtered through a membrane filter having a pore diameter of 0.2 μm to prepare a radiation-sensitive resin composition (J-52).

Examples 53 to 62 and Comparative Examples 12 to 15

Radiation-sensitive resin compositions (J-53) to (J-62) and (CJ-12) to (CJ-15) were prepared in the same manner as in Example 52 except that the components of the types and contents shown in the following Table 6 were used.

TABLE 6

| | Radiation-sensitive resin composition | [A] Resin | | [B] Radiation-sensitive acid generator | | [C] Acid diffusion controlling agent | | [E] High fluorine-content resin | | [D] Solvent | |
|---|---|---|---|---|---|---|---|---|---|---|---|
| | | Type | Content (parts by mass) | Type | Content (parts by mass) | Type | Content (parts by mass) | Type | Content (parts by mass) | Type | Content (parts by mass) |
| Example 52 | J-52 | A-12 | 100 | B-5 | 15.0 | C-1 | 4.0 | E-5 | 3.0 | D-1/D-4 | 4280/1830 |
| Example 53 | J-53 | A-12 | 100 | B-5 | 15.0 | C-3 | 4.0 | E-5 | 3.0 | D-1/D-4 | 4280/1830 |
| Example 54 | J-54 | A-12 | 100 | B-5 | 15.0 | C-5 | 4.0 | E-5 | 3.0 | D-1/D-4 | 4280/1830 |
| Example 55 | J-55 | A-12 | 100 | B-5 | 15.0 | C-8 | 4.0 | E-5 | 3.0 | D-1/D-4 | 4280/1830 |
| Example 56 | J-56 | A-12 | 100 | B-5 | 15.0 | C-12 | 4.0 | E-5 | 3.0 | D-1/D-4 | 4280/1830 |
| Example 57 | J-57 | A-13 | 100 | B-5 | 15.0 | C-1 | 4.0 | E-5 | 3.0 | D-1/D-4 | 4280/1830 |
| Example 58 | J-58 | A-14 | 100 | B-5 | 15.0 | C-1 | 4.0 | E-5 | 3.0 | D-1/D-4 | 4280/1830 |
| Example 59 | J-59 | A-15 | 100 | B-5 | 15.0 | C-1 | 4.0 | E-5 | 3.0 | D-1/D-4 | 4280/1830 |
| Example 60 | J-60 | A-12 | 100 | B-1 | 15.0 | C-1 | 4.0 | E-5 | 3.0 | D-1/D-4 | 4280/1830 |
| Example 61 | J-61 | A-12 | 100 | B-3 | 15.0 | C-1 | 4.0 | E-5 | 3.0 | D-1/D-4 | 4280/1830 |
| Example 62 | J-62 | A-12 | 100 | B-6 | 15.0 | C-1 | 4.0 | E-5 | 3.0 | D-1/D-4 | 4280/1830 |
| Comparative Example 12 | CJ-12 | A-12 | 100 | B-5 | 15.0 | cc-1 | 4.0 | E-5 | 3.0 | D-1/D-4 | 4280/1830 |
| Comparative Example 13 | CJ-13 | A-12 | 100 | B-5 | 15.0 | cc-6 | 4.0 | E-5 | 3.0 | D-1/D-4 | 4280/1830 |
| Comparative Example 14 | CJ-14 | A-12 | 100 | B-5 | 15.0 | cc-7 | 4.0 | E-5 | 3.0 | D-1/D-4 | 4280/1830 |
| Comparative Example 15 | CJ-15 | A-12 | 100 | B-5 | 15.0 | cc-8 | 4.0 | E-5 | 3.0 | D-1/D-4 | 4280/1830 |

<Formation of Resist Pattern Using Positive Radiation-Sensitive Resin Composition for EUV Exposure>

A composition for forming an underlayer antireflective film ("ARC66" manufactured by Brewer Science, Inc.) was applied onto a 12 inch silicon wafer using a spin coater ("CLEAN TRACK ACT12" manufactured by Tokyo Electron Limited), and then heated at 205° C. for 60 seconds to form an underlayer antireflective film having an average thickness of 105 nm. The positive radiation-sensitive resin composition for EUV exposure prepared above was applied onto the underlayer antireflective film using the spin coater, and subjected to PB at 130° C. for 60 seconds. Thereafter, cooling was performed at 23° C. for 30 seconds to form a resist film having an average thickness of 55 nm. Subsequently, this resist film was exposed with an EUV exposure apparatus ("NXE3300" manufactured by ASML Holding N.V.) with an NA of 0.33 under an illumination condition of conventional illumination (s=0.89), and with a mask of imecDEFECT32FFR02. After the exposure, PEB was performed at 120° C. for 60 seconds. Thereafter, the resist film was subjected to alkaline development using a 2.38 mass % aqueous TMAH solution as an alkaline developer, and after the development, the resist film was washed with water and further dried to form a positive resist pattern (32 nm line-and-space pattern).

<Evaluation>

The sensitivity and LWR performance of each of resist patterns formed using the positive radiation-sensitive resin compositions for EUV exposure were evaluated according to the following methods. The results are shown in the following Table 7. It is to be noted that a scanning electron microscope ("CG-5000" manufactured by Hitachi High-Tech Corporation) was used for measurement of the resist pattern.

[Sensitivity]

In formation of the resist pattern using the positive radiation-sensitive resin composition for EUV exposure, an exposure dose at which a 32 nm line-and-space pattern was formed was defined as an optimum exposure dose, and this optimum exposure dose was defined as sensitivity (mJ/cm$^2$). A case where the sensitivity was 30 mJ/cm$^2$ or less was evaluated as "good", and a case where the sensitivity exceeded 30 mJ/cm$^2$ was evaluated as "poor".

[LWR Performance]

A resist pattern was formed with the mask size adjusted so as to form a 32 nm line-and-space pattern by irradiation with the optimum exposure dose obtained in the evaluation of the sensitivity. The formed resist pattern was observed from above the pattern using the scanning electron microscope. The variation in line width was measured at 500 points in total, the value of 3σ was obtained from the distribution of the measured values, and the value of 3σ was defined as LWR (nm). A smaller value of LWR indicates smaller displacement of the line and better performance. A case where the LWR performance was 3.5 nm or less was evaluated as "good", and a case where the LWR performance exceeded 3.5 nm was evaluated as "poor".

TABLE 7

| | Radiation-sensitive resin composition | Sensitivity (mJ/cm$^2$) | LWR (nm) |
|---|---|---|---|
| Example 52 | J-52 | 25 | 3.1 |
| Example 53 | J-53 | 23 | 3.3 |
| Example 54 | J-54 | 21 | 2.9 |
| Example 55 | J-55 | 22 | 3.2 |
| Example 56 | J-56 | 24 | 3.3 |
| Example 57 | J-57 | 24 | 3.0 |
| Example 58 | J-58 | 25 | 3.2 |
| Example 59 | J-59 | 25 | 3.1 |
| Example 60 | J-60 | 26 | 3.1 |
| Example 61 | J-61 | 28 | 3.2 |
| Example 62 | J-62 | 25 | 3.3 |
| Comparative Example 12 | CJ-12 | 35 | 3.8 |
| Comparative Example 13 | CJ-13 | 36 | 4.1 |
| Comparative Example 14 | CJ-14 | 32 | 3.8 |
| Comparative Example 15 | CJ-15 | 33 | 3.7 |

As is apparent from the results in Table 7, the radiation-sensitive resin compositions of Examples were superior in sensitivity and LWR performance when used for EUV exposure, whereas the radiation-sensitive resin compositions of Comparative Examples were inferior in characteristics to those of Examples.

[Preparation of Negative Radiation-Sensitive Resin Composition for ArF Exposure, and Formation and Evaluation of Resist Pattern Using this Composition]

Example 63

First, 100 parts by mass of (A-6) as a resin, 12.0 parts by mass of (B-5) as a radiation-sensitive acid generator, 4.0 parts by mass of (C-1) as an acid diffusion controlling agent, 3.0 parts by mass (solid content) of (E-3) as a high fluorine-content resin, and 3,230 parts by mass of a mixed solvent of (D-1)/(D-2)/(D-3)=70/29/1 (mass ratio) as a solvent were mixed, and the mixture was filtered through a membrane filter having a pore diameter of 0.2 μm to prepare a radiation-sensitive resin composition (J-63).

A composition for forming an underlayer antireflective film ("ARC66" manufactured by Brewer Science, Inc.) was applied onto a 12 inch silicon wafer using a spin coater ("CLEAN TRACK ACT12" manufactured by Tokyo Electron Limited), and then heated at 205° C. for 60 seconds to form an underlayer antireflective film having an average thickness of 105 nm. The negative radiation-sensitive resin composition for ArF exposure (J-86) prepared above was applied onto the underlayer antireflective film using the spin coater, and subjected to PB (prebake) at 90° C. for 60 seconds. Thereafter, cooling was performed at 23° C. for 30 seconds to form a resist film having an average thickness of 90 nm. Subsequently, this resist film was exposed through a mask pattern of 40 nm space and 105 nm pitch using an ArF excimer laser immersion exposure apparatus ("TWINSCAN XT-1900i" manufactured by ASML Holding N.V.) under optical conditions of a numeral aperture (NA) of 1.35 and annular illumination (σ=0.8/0.6). After the exposure, PEB (post exposure bake) was performed at 90° C. for 60 seconds. Thereafter, the resist film was developed with n-butyl acetate as an organic solvent developer, and dried to form a negative resist pattern (40 nm line-and-space pattern).

The resist pattern using the negative radiation-sensitive resin composition for ArF exposure was evaluated in the same manner as in the evaluation of the resist pattern using the positive radiation-sensitive resin composition for ArF exposure. As a result, the radiation-sensitive resin composition of Example 63 was superior in sensitivity, LWR performance, and CDU performance even when a negative resist pattern was formed by ArF exposure.

[Preparation of Negative Radiation-Sensitive Resin Composition for EUV Exposure, and Formation and Evaluation of Resist Pattern Using this Composition]

Example 64

100 parts by mass of (A-15) as a resin, 21.0 parts by mass of (B-4) as a radiation-sensitive acid generator, 5.0 parts by mass of (C-2) as an acid diffusion controlling agent, 2.0 parts by mass (solid content) of (E-5) as a high fluorine-content resin, and 6,110 parts by mass of a mixed solvent of (D-1)/(D-4)=70/30 (mass ratio) as a solvent were mixed, and the mixture was filtered through a membrane filter having a pore size of 0.2 μm to prepare a radiation-sensitive resin composition (J-64).

A composition for forming an underlayer antireflective film ("ARC66" manufactured by Brewer Science, Inc.) was applied onto a 12 inch silicon wafer using a spin coater ("CLEAN TRACK ACT12" manufactured by Tokyo Electron Limited), and then heated at 205° C. for 60 seconds to form an underlayer antireflective film having an average thickness of 105 nm. The negative radiation-sensitive resin composition for EUV exposure (J-64) prepared above was applied onto the underlayer antireflective film using the spin coater, and subjected to PB at 130° C. for 60 seconds. Thereafter, cooling was performed at 23° C. for 30 seconds to form a resist film having an average thickness of 55 nm. Subsequently, this resist film was exposed with an EUV exposure apparatus ("NXE3300" manufactured by ASML Holding N.V.) with an NA of 0.33 under an illumination condition of conventional illumination (s=0.89), and with a mask of imecDEFECT32FFR02. After the exposure, PEB was performed at 120° C. for 60 seconds. Thereafter, the resist film was developed with n-butyl acetate as an organic solvent developer, and dried to form a negative resist pattern (32 nm line-and-space pattern).

The resist pattern using the negative radiation-sensitive resin composition for EUV exposure was evaluated in the same manner as in the evaluation of the resist pattern using the positive radiation-sensitive resin composition for EUV exposure. As a result, the radiation-sensitive resin composition of Example 64 was superior in sensitivity and LWR performance even when a negative resist pattern was formed by EUV exposure.

According to the radiation-sensitive resin composition and the resist pattern forming method described above, a resist pattern that is superior in sensitivity to exposure light and excellent in LWR performance and CDU performance can be formed. Therefore, these can be suitably used for a processing process of a semiconductor device in which micronization is expected to further progress in the future.

Obviously, numerous modifications and variations of the present invention are possible in light of the above teachings. It is therefore to be understood that within the scope of the appended claims, the invention may be practiced otherwise than as specifically described herein.

What is claimed is:

1. A radiation-sensitive resin composition comprising:
   an onium salt compound represented by formula (1');
   a resin comprising a structural unit having an acid-dissociable group;
   a radiation-sensitive acid generator capable of generating an acid upon exposure, the acid having a pKa smaller than a pKa of an acid generated by the onium salt compound upon exposure; and
   a solvent:

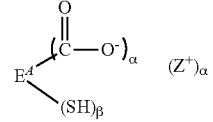

(1')

wherein $E^4$ is a substituted or unsubstituted $(\alpha+\beta)$-valent organic group having 1 to 40 carbon atoms,
   $Z^+$ is a monovalent radiation-sensitive onium cation, and
   $\alpha$ and $\beta$ are each independently 1 or 2,
   wherein the acid generated by the onium salt compound does not substantially dissociate the acid-dissociable group of the resin.

2. The radiation-sensitive resin composition according to claim 1, wherein in the formula (1'), $\alpha$ and $\beta$ are the same number.

3. The radiation-sensitive resin composition according to claim 1, wherein the onium salt compound represented by the formula (1') is an onium salt compound represented by formula (1) below:

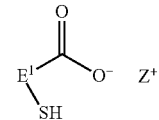

(1)

wherein $E^1$ is a substituted or unsubstituted divalent organic group having 1 to 40 carbon atoms, and $Z^+$ is as defined in the formula (1').

4. The radiation-sensitive resin composition according to claim 3, wherein $E^1$ is a substituted or unsubstituted divalent chain hydrocarbon group having 1 to 20 carbon atoms, a substituted or unsubstituted divalent alicyclic hydrocarbon group having 3 to 20 carbon atoms, or a substituted or unsubstituted divalent aromatic hydrocarbon group having 6 to 20 carbon atoms.

5. The radiation-sensitive resin composition according to claim 3, wherein $E^1$ is a substituted or unsubstituted divalent aromatic hydrocarbon group having 6 to 20 carbon atoms.

6. The radiation-sensitive resin composition according to claim 3, wherein part or all of hydrogen atoms on carbon atoms in the substituted or unsubstituted divalent organic group represented by $E^1$ are substituted with a halogen atom or a halogenated alkyl group.

7. The radiation-sensitive resin composition according to claim 3, wherein the minimum number of atoms on a path connecting the carbon atom of the carbonyl group bonded to $E^1$ and the sulfur atom of the sulfanyl group bonded to $E^1$ is from 1 to 6.

8. The radiation-sensitive resin composition according to claim 3, wherein the minimum number of atoms on a path connecting the carbon atom of the carbonyl group bonded to $E^1$ and the sulfur atom of the sulfanyl group bonded to $E^1$ is 1 or 2.

9. The radiation-sensitive resin composition according to claim 1, wherein the radiation-sensitive onium cation is a radiation-sensitive sulfonium cation or a radiation-sensitive iodonium cation.

10. The radiation-sensitive resin composition according to claim 1, wherein a content of the onium salt compound is 0.01 parts by mass or more and 30 parts by mass or less with respect to 100 parts by mass of the resin.

11. A method for forming a pattern, the method comprising:
   directly or indirectly applying the radiation-sensitive resin composition according to claim 1 onto a substrate to form a resist film;
   exposing the resist film; and
   developing the exposed resist film with a developer.

12. The radiation-sensitive resin composition according to claim 1, wherein a content of the onium salt compound is 0.1 parts by mass or more and 20 parts by mass or less with respect to 100 parts by mass of the resin.

13. The radiation-sensitive resin composition according to claim 1, wherein a content of the onium salt compound is 0.2 parts by mass or more and 15 parts by mass or less with respect to 100 parts by mass of the resin.

14. The radiation-sensitive resin composition according to claim 1, wherein the radiation-sensitive acid generator generates a sulfonic acid upon exposure.

15. The radiation-sensitive resin composition according to claim 1, wherein a content of the radiation-sensitive acid generator is 0.1 parts by mass or more and 40 parts by mass or less with respect to 100 parts by mass of the resin.

16. The radiation-sensitive resin composition according to claim 1, wherein a content of the radiation-sensitive acid generator is 1 parts by mass or more and 30 parts by mass or less with respect to 100 parts by mass of the resin.

17. The radiation-sensitive resin composition according to claim 1, wherein a content of the radiation-sensitive acid generator is 5 parts by mass or more and 20 parts by mass or less with respect to 100 parts by mass of the resin.

* * * * *